US007239993B2

(12) United States Patent
Roesner et al.

(10) Patent No.: US 7,239,993 B2
(45) Date of Patent: Jul. 3, 2007

(54) METHOD, SYSTEM AND PROGRAM PRODUCT THAT AUTOMATICALLY GENERATE COVERAGE INSTRUMENTATION FOR CONFIGURATION CONSTRUCTS WITHIN A DIGITAL SYSTEM

(75) Inventors: Wolfgang Roesner, Austin, TX (US); Derek Edward Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 613 days.

(21) Appl. No.: 10/651,156

(22) Filed: Aug. 28, 2003

(65) Prior Publication Data

US 2005/0049842 A1 Mar. 3, 2005

(51) Int. Cl.
*G06F 17/50* (2006.01)

(52) U.S. Cl. .......................... 703/13; 703/14; 703/15; 703/16; 703/17

(58) Field of Classification Search ............. 703/13–17
See application file for complete search history.

(56) References Cited

U.S. PATENT DOCUMENTS

| 6,195,627 | B1 * | 2/2001 | Bargh et al. ................. 703/14 |
| 6,247,147 | B1 * | 6/2001 | Beenstra et al. ............. 714/39 |
| 6,496,955 | B1 | 12/2002 | Chandra et al. |
| 6,618,839 | B1 * | 9/2003 | Beardslee et al. ............. 716/4 |
| 7,032,192 | B2 | 4/2006 | Prasad et al. |
| 7,069,526 | B2 * | 6/2006 | Schubert et al. ............... 716/4 |
| 7,080,347 | B2 * | 7/2006 | Hunt et al. ................... 716/18 |

OTHER PUBLICATIONS

Hadlich et al., "Modeling Distributed Systems with Reconfigurable Logic", Proceedings of the IEEE International Symposium on Industrial Electronics, Jul. 1997, pp. SS176-SS180.*

* cited by examiner

*Primary Examiner*—Kamini Shah
*Assistant Examiner*—Herng-der Day
(74) *Attorney, Agent, or Firm*—Casimer K. Salys; Dillon & Yudell LLP

(57) ABSTRACT

A method, data processing system, and program product for building an instrumented simulation model of a digital design are disclosed. According to the method, a model build tool locates, within design data collectively defining a simulation model of the digital design, a definition of a configuration construct specifying a relationship between values of one or more configuration latches within the digital design and settings of the configuration construct. In response to locating the definition of the configuration construct, the model build tool automatically creates an instrumentation entity within the design data. The instrumentation entity has one or more inputs logically coupled to the one or more configuration latches and one or more outputs for providing signals indicating characteristics of the configuration construct during simulation.

21 Claims, 14 Drawing Sheets

```
ENTITY A IS
  PORT
  (
                                         -- port_list
  );
END A;                                            } 402

ARCHITECTURE A OF A IS
  ...                                    -- signal declarations } 404
BEGIN
  ...                                    -- HDL code
  --##cfg_file file00;     } 412
  ...                                    -- HDL code
  --!! Instrumentation: Inst_entity_name.vhdl   } 420
END;                                                              } 406
``` file00.cfg  ⎰414 statementA  ⎫
statementB  ⎬ 408
statementC  ⎭
statementD  ⎫
statementE  ⎬ 410
statementF  ⎭

Instrumentation Entity HDL File 422

Instr_entity_name.vhdl

METHOD, SYSTEM AND PROGRAM PRODUCT THAT AUTOMATICALLY GENERATE COVERAGE INSTRUMENTATION FOR CONFIGURATION CONSTRUCTS WITHIN A DIGITAL SYSTEM

CROSS-REFERENCE TO RELATED APPLICATIONS

The present application is related to the following co-pending U.S. patent applications, which are assigned to the assignee of the present application and incorporated herein by reference in their entireties:
(1) U.S. patent application Ser. No. 10/366,438, filed Feb. 13, 2003; and
(2) U.S. patent application Ser. No. 10/425,076, filed Apr. 28, 2003.

BACKGROUND OF THE INVENTION

1. Technical Field

The present invention relates in general to designing, simulating and configuring digital devices, modules and systems, and in particular, to methods and systems for computer-aided design, simulation, and configuration of digital devices, modules and systems described by a hardware description language (HDL) model.

2. Description of the Related Art

In a conventional automated design process utilizing an electronic computer-aided design (ECAD) system, a designer enters a high-level description of a digital design utilizing a hardware description language (HDL), such as VHDL, producing a digital representation of various circuit blocks and their interconnections. The ECAD system compiles the design description into a format (often called a simulation model) that is best suited for simulation. A simulator is then utilized to verify the logical correctness of the digital design prior to developing a circuit layout.

A simulator is typically a software tool that applies a list of input stimuli representing inputs of the digital design to the simulation model to generate a numerical representation of the response of the digital design. The numerical representation of the response may then either be presented on a display as a list of values or further interpreted, often by a separate software program, and presented in graphical form.

As discussed in detail in above-referenced U.S. patent application Ser. No. 10/366,438, the accuracy and completeness of the simulation data generated by the simulator can be improved by the designer including, within the HDL files defining the functional portion of the simulation model, references to instrumentation entities. These instrumentation entities, although not forming a functional portion of the digital design, can perform a number of important checking functions during simulation. Such instrumentation entities can include, for example, logical failure detectors and event and cycle counters.

The designer's control of the simulation and operation of a digital design can be further enhanced by the definition of configuration constructs (e.g., Dials) within the HDL files specifying the digital design. As described in detail in above-referenced U.S. patent application Ser. No. 10/425,076, Dials can be logically connected to the various configuration latches distributed throughout a digital design in order to provide a well-defined interface through which appropriate configuration values may be loaded into the configuration latches.

The present invention recognizes that while instrumentation entities have been defined to monitor and collect simulation data regarding the operation of the design entities comprising the functional portion of a digital design under simulation, heretofore there has been no convenient method and system for generating instrumentation entities to collect simulation data regarding configuration constructs, such as Dials. In particular, prior to the present invention, there has been no automated method and system for generating instrumentation entities to collect important simulation data, such as the number of testcases and simulation cycles that have been executed for each combination of configuration latch settings.

SUMMARY OF THE INVENTION

In view of the foregoing, the present invention provides a method, system and program product for automatically generating instrumentation entities that collect simulation data regarding configuration constructs (e.g., Dials) utilized to configure a simulation model of a digital design.

In one embodiment of the present invention, a model build tool locates, within design data collectively defining a simulation model of a digital design, a definition of a configuration construct specifying a relationship between values of one or more configuration latches within the digital design and settings of the configuration construct. In response to locating the definition of the configuration construct, the model build tool automatically creates an instrumentation entity within the design data. The instrumentation entity has one or more inputs logically coupled to the one or more configuration latches and one or more outputs for providing signals indicating characteristics of the configuration construct during simulation.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

FIG. 4B illustrates an exemplary HDL file including an embedded configuration file reference statement referring to an external configuration file containing a configuration specification statement in accordance with the present invention;

DETAILED DESCRIPTION OF ILLUSTRATIVE EMBODIMENT

Figure 1:
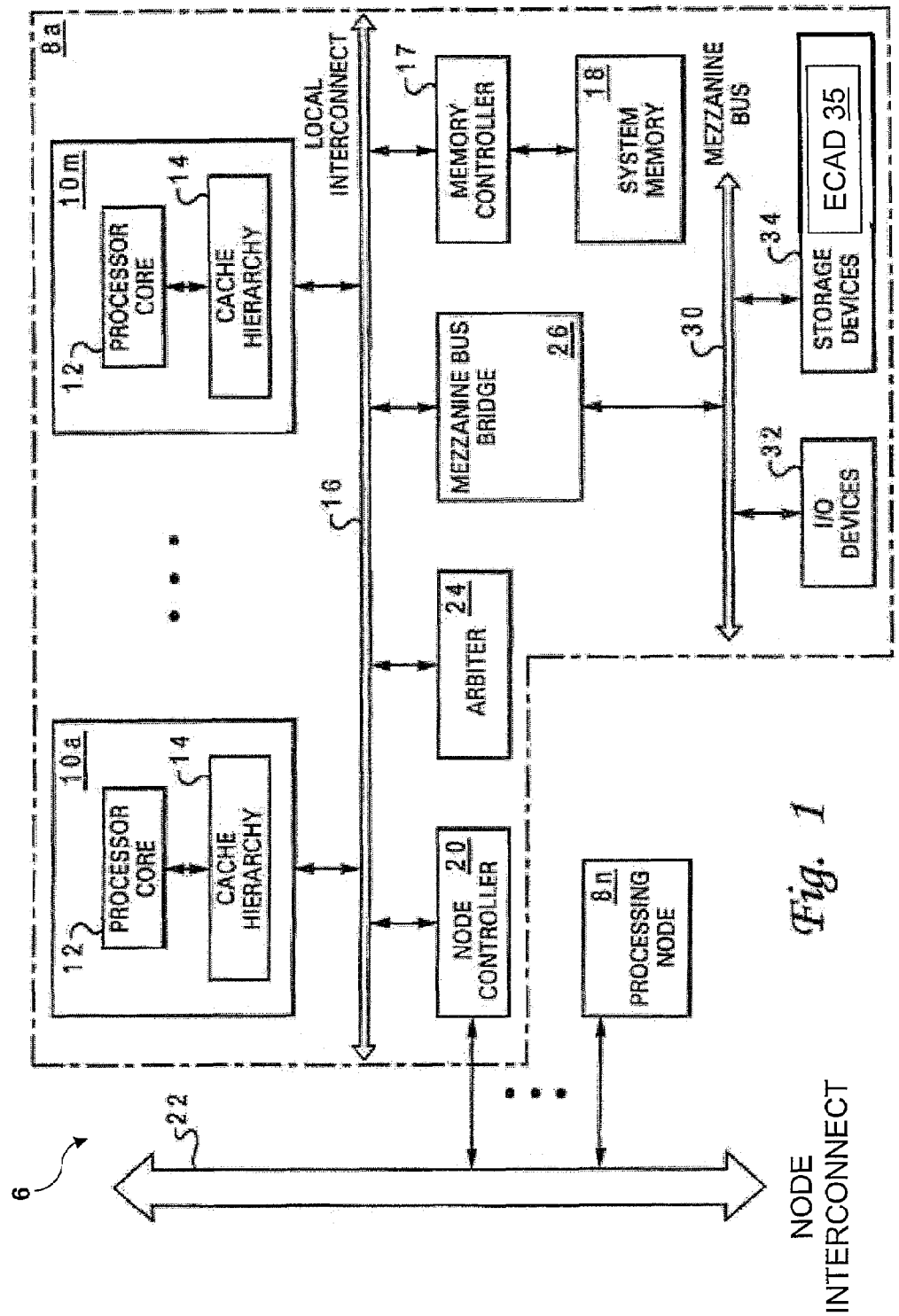
FIG. 1 is a high level block diagram of a data processing system that may be utilized to implement the present invention.

With reference now to the figures, and in particular with reference to FIG. 1, there is depicted an exemplary embodiment of a data processing system that may be utilized to build and execute a simulation model containing configuration and instrumentation entities in accordance with the present invention. The depicted embodiment can be realized, for example, as a workstation, server, or mainframe computer.

As illustrated, data processing system 6 includes one or more processing nodes 8a–8n, which, if more than one processing node 8 is implemented, are interconnected by node interconnect 22. Processing nodes 8a–8n may each include one or more processors 10, a local interconnect 16, and a system memory 18 that is accessed via a memory controller 17. Processors 10a–10m are preferably (but not necessarily) identical and may comprise a processor within the POWER™ line of processors available from International Business Machines (IBM) Corporation of Armonk, New York. In addition to the registers, instruction flow logic and execution units utilized to execute program instructions, which are generally designated as processor core 12, each of processors 10a–10m also includes an on-chip cache hierarchy 14 that is utilized to stage data to the associated processor core 12 from system memories 18.

Each of processing nodes 8a–8n further includes a respective node controller 20 coupled between local interconnect 16 and node interconnect 22. Each node controller 20 serves as a local agent for remote processing nodes 8 by performing at least two functions. First, each node controller 20 snoops the associated local interconnect 16 and facilitates the transmission of local communication transactions to remote processing nodes 8. Second, each node controller 20 snoops communication transactions on node interconnect 22 and masters relevant communication transactions on the associated local interconnect 16. Communication on each local interconnect 16 is controlled by an arbiter 24. Arbiters 24 regulate access to local interconnects 16 based on bus request signals generated by processors 10 and compile coherency responses for snooped communication transactions on local interconnects 16.

Local interconnect 16 is coupled, via mezzanine bus bridge 26, to a mezzanine bus 30. Mezzanine bus bridge 26 provides both a low latency path through which processors 10 may directly access devices among I/O devices 32 and storage devices 34 that are mapped to bus memory and/or I/O address spaces and a high bandwidth path through which I/O devices 32 and storage devices 34 may access system memory 18. I/O devices 32 may include, for example, a display device, a keyboard, a graphical pointer, and serial and parallel ports for connection to external networks or attached devices. Storage devices 34 may include, for example, optical or magnetic disks that provide non-volatile storage for operating system, middleware and application software. In the present embodiment, such application software includes an ECAD system 35, which can be utilized to develop, verify and simulate a digital circuit design in accordance with the methods and systems of the present invention.

Figure 2:
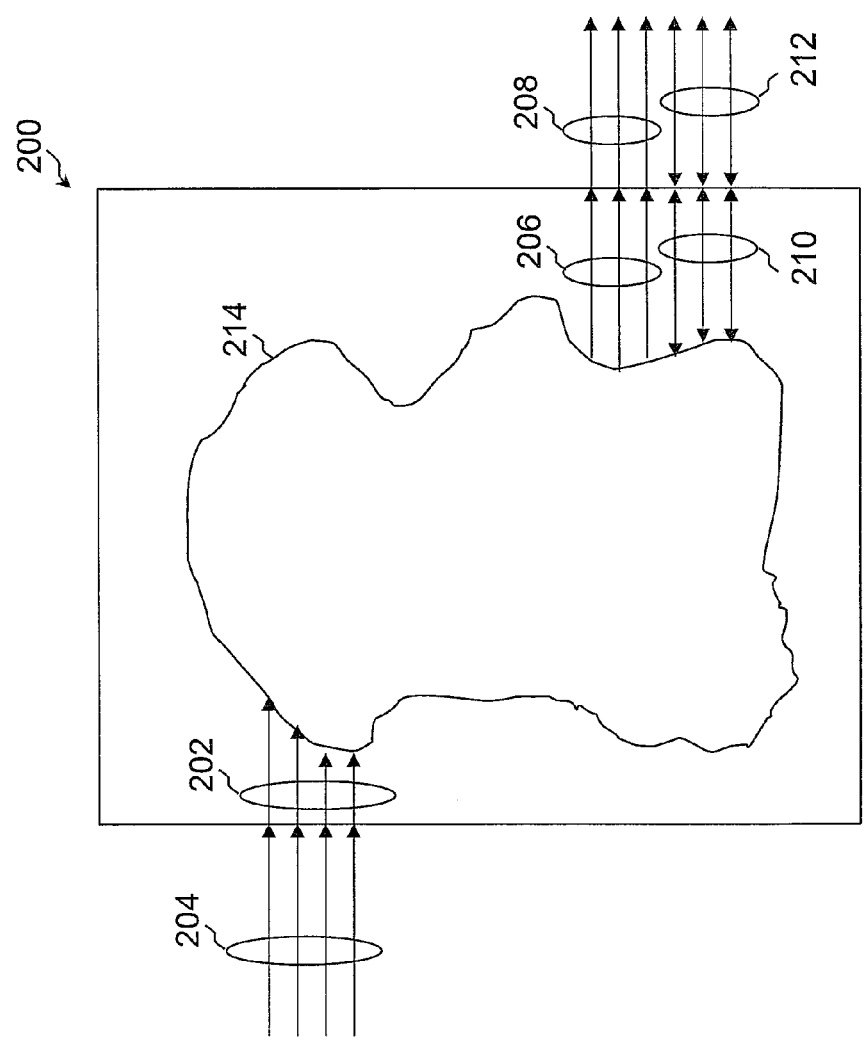
FIG. 2 is a diagrammatic representation of a design entity described by HDL code.

Simulation models of digital circuit designs created utilizing ECAD system 35 are comprised of at least one, and usually many, sub-units referred to hereinafter as design entities. Referring now to FIG. 2, there is illustrated a block diagram representation of an exemplary design entity 200 which may be created utilizing ECAD system 35. Design entity 200 is defined by a number of components: an entity name, entity ports, and a representation of the function performed by design entity 200. Each design entity within a given model has a unique entity name (not explicitly shown in FIG. 2) that is declared in the HDL description of the design entity. Furthermore, each design entity typically contains a number of signal interconnections, known as ports, to signals outside the design entity. These outside signals may be primary input/outputs (I/Os) of an overall design or signals connected to other design entities within an overall design.

Typically, ports are categorized as belonging to one of three distinct types: input ports, output ports, and bi-directional ports. Design entity 200 is depicted as having a number of input ports 202 that convey signals into design entity 200. Input ports 202 are connected to input signals 204. In addition, design entity 200 includes a number of output ports 206 that convey signals out of design entity 200. Output ports 206 are connected to a set of output signals 208. Bi-directional ports 210 are utilized to convey signals into and out of design entity 200. Bi-directional ports 210 are in turn connected to a set of bi-directional signals 212. A design entity, such as design entity 200, need not contain ports of all three types, and in the degenerate case, contains no ports at all. To accomplish the connection of entity ports to external signals, a mapping technique, known as a "port map", is utilized. A port map (not explicitly depicted in FIG. 2) consists of a specified correspondence between entity port names and external signals to which the entity is connected. When building a simulation model, ECAD software 35 is utilized to connect external signals to appropriate ports of the design entity according to a port map specification.

As further illustrated in FIG. 2, design entity 200 contains a body section 214 that describes one or more functions performed by design entity 200. In the case of a digital design, body section 214 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Each design entity is specified by one or more HDL files that contain the information necessary to describe the design entity. Although not required by the present invention, it will hereafter be assumed for ease of understanding that each design entity is specified by a respective HDL file.

Figure 3:
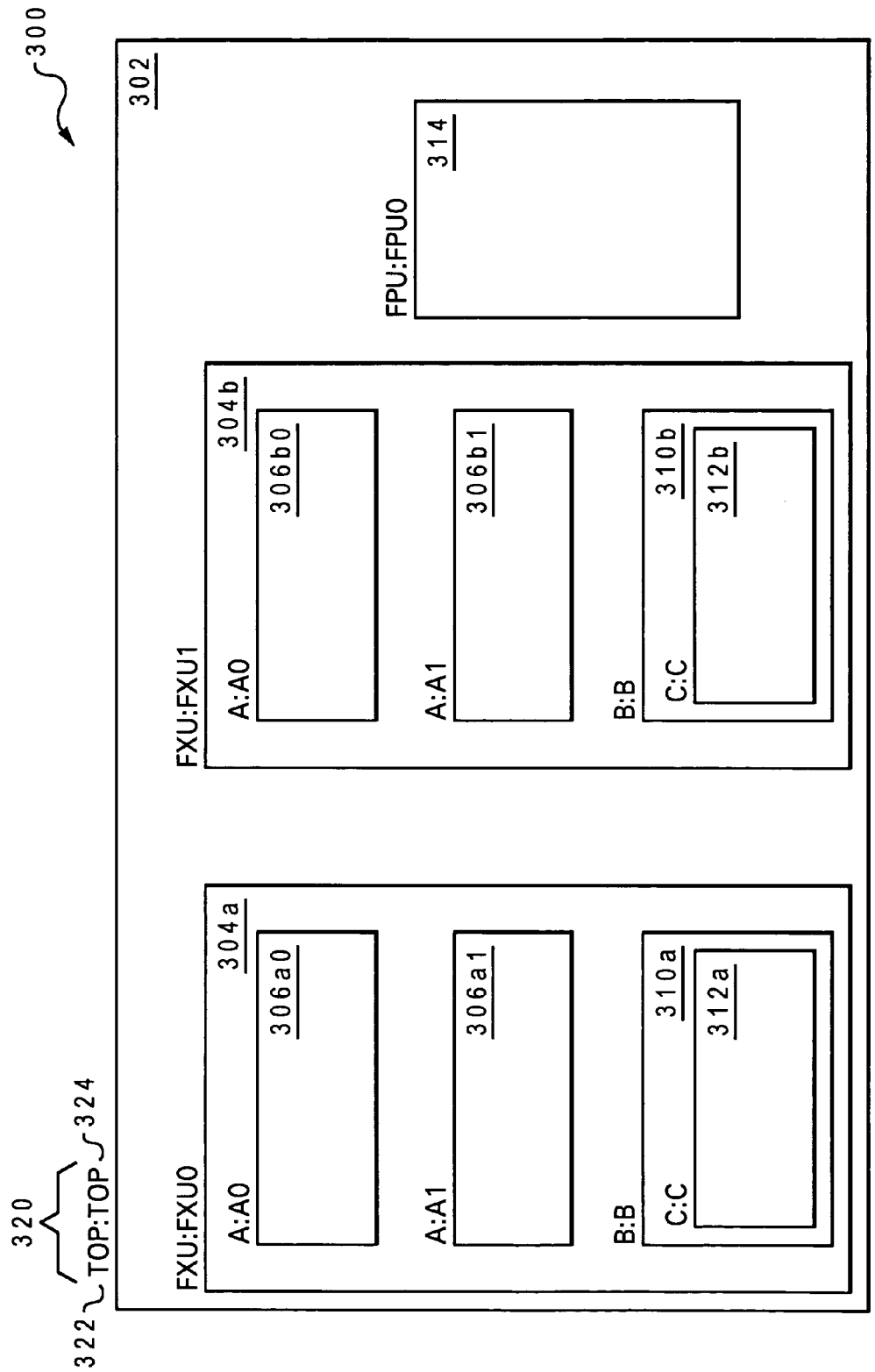
FIG. 3 illustrates an exemplary digital design including a plurality of hierarchically arranged design entities.

With reference now to FIG. 3, there is illustrated a diagrammatic representation of an exemplary simulation model 300 that may be employed by ECAD system 35 to represent a digital design (e.g., an integrated circuit chip or a computer system) in a preferred embodiment of the present invention. For visual simplicity and clarity, the ports and signals interconnecting the design entities within simulation model 300 have not been explicitly shown.

Simulation model 300 includes a number of hierarchically arranged design entities. As within any simulation model, simulation model 300 includes one and only one "top-level entity" encompassing all other entities within simulation model 300. That is to say, top-level entity 302 instantiates, either directly or indirectly, all descendant entities within the digital design. Specifically, top-level entity 302 directly instantiates (i.e., is the direct ancestor of) two instances, 304a and 304b, of the same FiXed-point execution Unit (FXU) entity 304 and a single instance of a Floating Point Unit (FPU) entity 314. FXU entity instances 304, having instantiation names FXU0 and FXU1, respectively, in turn instantiate additional design entities, including multiple instantiations of entity A 306 having instantiation names A0 and A1, respectively.

Each instantiation of a design entity has an associated description that contains an entity name and an instantiation name, which must be unique among all descendants of the direct ancestor entity, if any. For example, top-level entity 302 has a description 320 including an entity name 322 (i.e., the "TOP" preceding the colon) and also includes an instantiation name 324 (i.e., the "TOP" following the colon). Within an entity description, it is common for the entity name to match the instantiation name when only one instance of that particular entity is instantiated within the ancestor entity. For example, single instances of entity B 310 and entity C 312 instantiated within each of FXU entity instantiations 304a and 304b have matching entity and instantiation names. However, this naming convention is not required by the present invention as shown by FPU entity 314 (i.e., the instantiation name is FPU0, while the entity name is FPU).

The nesting of entities within other entities in a digital design can continue to an arbitrary level of complexity, provided that all entities instantiated, whether singly or multiply, have unique entity names and the instantiation names of all descendant entities within any direct ancestor entity are unique with respect to one another.

Associated with each design entity instantiation is a so called "instantiation identifier". The instantiation identifier for a given instantiation is a string including the enclosing entity instantiation names proceeding from the top-level entity instantiation name. For example, the design instantiation identifier of instantiation 312a of entity C 312 within instantiation 304a of FXU entity 304 is "TOP.FXU0.B.C". This instantiation identifier serves to uniquely identify each instantiation within a simulation model.

As discussed above, a digital design, whether realized utilizing physical integrated circuitry or as a software model such as simulation model 300, typically includes configuration latches utilized to configure the digital design for proper operation. In contrast to prior art design methodologies that employ stand-alone configuration software to determine values for the configuration latches, the present invention employs a configuration specification language that permits a digital designer to specify configuration values for signals as a natural part of the design process. In particular, the configuration specification language of the present invention permits a design configuration to be specified utilizing statements either embedded in one or more HDL files specifying the digital design (as illustrated in FIG. 4A) or in one or more external configuration files referenced by the one or more HDL files specifying the digital design (as depicted in FIG. 4B).

Figure 4A:
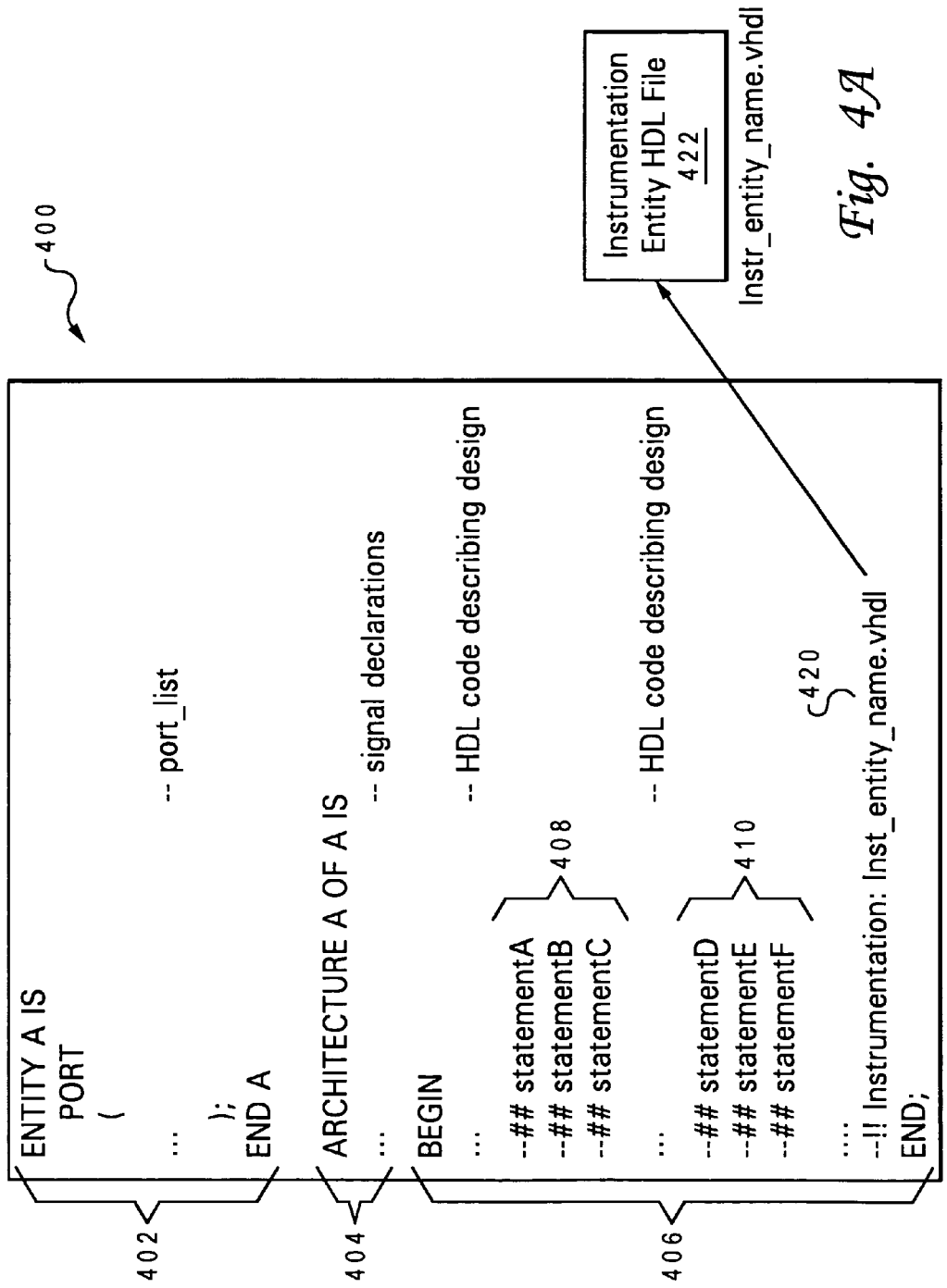
FIG. 4A depicts an exemplary HDL file including embedded configuration specification statements in accordance with the present invention.

Referring now to FIG. 4A, there is depicted an exemplary HDL file 400, in this case a VHDL file, including embedded configuration statements in accordance with the present invention. In this example, HDL file 400 specifies entity A 306 of simulation model 300 and includes three sections of VHDL code, namely, a port list 402 that specifies ports 202, 206 and 210, signal declarations 404 that specify the signals within body section 214, and a design specification 406 that specifies the logic and functionality of body section 214. Interspersed within these sections are conventional VHDL comments denoted by an initial double-dash ("--"). In addition, embedded within design specification 406 are one or more configuration specification statements in accordance with the present invention, which are collectively denoted by reference numerals 408 and 410. As shown, these configuration specification statements are written in a special comment form beginning with "--##" in order to permit a compiler to easily distinguish the configuration specification statements from the conventional HDL code and HDL comments. Configuration specification statements preferably employ a syntax that is insensitive to case and white space.

As further illustrated in FIG. 4A, HDL file 400 also includes an instrumentation entity instantiation 420 distinguished by a special comment form beginning with "--!!". Instrumentation entity instantiation 420 identifies by name ("Instr_entity_name.vhdl") an external instrumentation entity HDL file 422 containing an HDL (in this case, VHDL) definition of an instrumentation entity that is associated with and that collects simulation data regarding the operation of entity A 306 defined by HDL file 400. A detailed description of instrumentation entity HDL file 422 may be found in above-referenced U.S. patent application Ser. No. 10/366,438.

With reference now to FIG. 4B, there is illustrated an exemplary HDL file 400' that includes a reference to an external configuration file containing one or more configuration specification statements in accordance with the present invention. As indicated by prime notation ('), HDL file 400' is identical to HDL file 400 in all respects except that configuration specification statements 408, 410 are replaced with one or more (and in this case only one) configuration file reference statement 412 referencing a separate configuration file 414 containing configuration specification statements 408, 410.

Configuration file reference statement 412, like the embedded configuration specification statements illustrated in FIG. 4A, is identified as a configuration statement by the identifier "--##". Configuration file reference statement 412 includes the directive "cfg_file", which instructs the compiler to locate a separate configuration file 414, and the filename of the configuration file (i.e., "file00"). Configuration files, such as configuration file 412, preferably all employ a selected filename extension (e.g., ".cfg") so that they can be easily located, organized, and managed within the file system employed by data processing system 6.

As discussed further below with reference to FIG. 8, configuration specification statements and instrumentation specification statements, whether embedded within an HDL file or collected in one or more configuration files 414, are processed by a compiler together with the associated HDL files.

In accordance with a preferred embodiment of the present invention, configuration specification statements, such as configuration specification statements 408, 410, facilitate configuration of configuration latches within a digital design by instantiating one or more instances of a configuration construct referred to herein generically as a "Dial." A Dial's function is to map between an input value and one or more output values. In general, such output values ultimately directly or indirectly specify configuration values of configuration latches. Each Dial is associated with a particular design entity in the digital design, which by convention is the design entity specified by the HDL source file containing the configuration specification statement or configuration file reference statement that causes the Dial to be instantiated. Consequently, by virtue of their association with particular design entities, which all have unique instantiation identifiers, Dials within a digital design can be uniquely identified as long as unique Dial names are employed within any given design entity. As will become apparent, many different types of Dials can be defined, beginning with a Latch Dial (or "LDial").

Figure 5A:
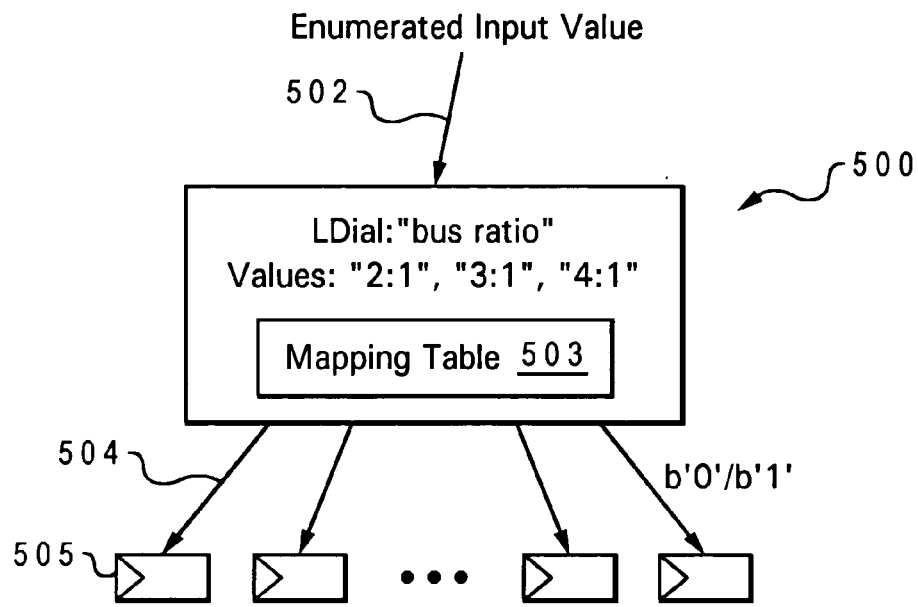
FIG. 5A is a diagrammatic representation of an LDial primitive in accordance with the present invention

Referring now to FIG. 5A, there is depicted a representation of an exemplary LDial 500. In this particular example, LDial 500, which has the name "bus ratio", is utilized to specify values for configuration latches in a digital design in accordance with an enumerated input value representing a selected ratio between a component clock frequency and bus clock frequency.

As illustrated, LDial 500, like all Dials, logically has a single input 502, one or more outputs 504, and a mapping table 503 that maps each input value to a respective associated output value for each output 504. That is, mapping table 503 specifies a one-to-one mapping between each of one or more unique input values and a respective associated unique output value. Because the function of an LDial is to specify the legal values of configuration latches, each output 504 of LDial 500 logically controls the value loaded into a respective configuration latch 505. To prevent conflicting configurations, each configuration latch 505 is directly specified by one and only one Dial of any type that is capable of setting the configuration latch 505.

At input 502, LDial 500 receives an enumerated input value (i.e., a string) among a set of legal values including "2:1", "3:1" and "4:1". The enumerated input value can be provided directly by software (e.g., by a software simulator or service processor firmware) or can be provided by the output of another Dial, as discussed further below with respect to FIG. 7A. For each enumerated input value, the mapping table 503 of LDial 500 indicates a selected binary value (i.e., "0" or "1") for each configuration latch 505.

Figure 5D:
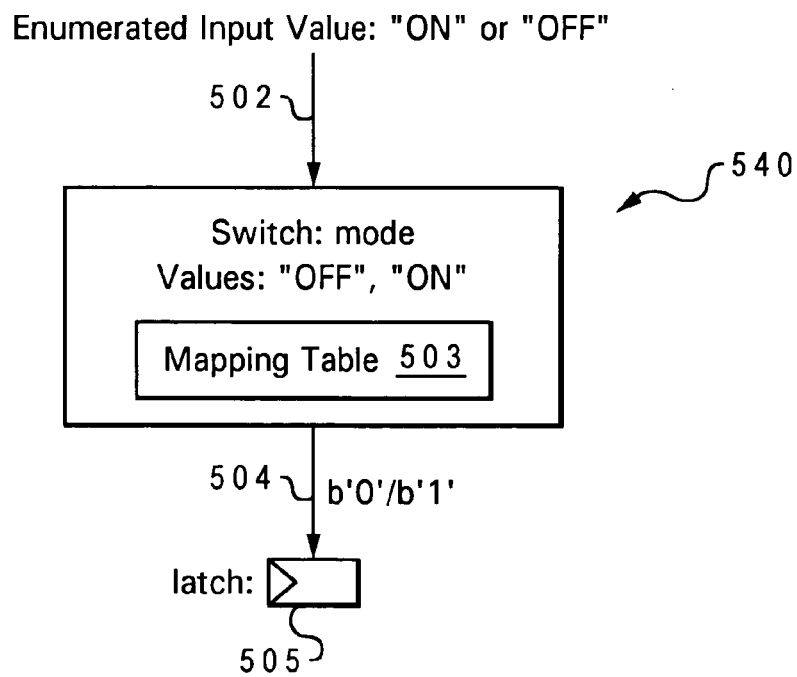
FIG. 5D is a diagrammatic representation of a Switch in accordance with the present invention.
Figure 5B:
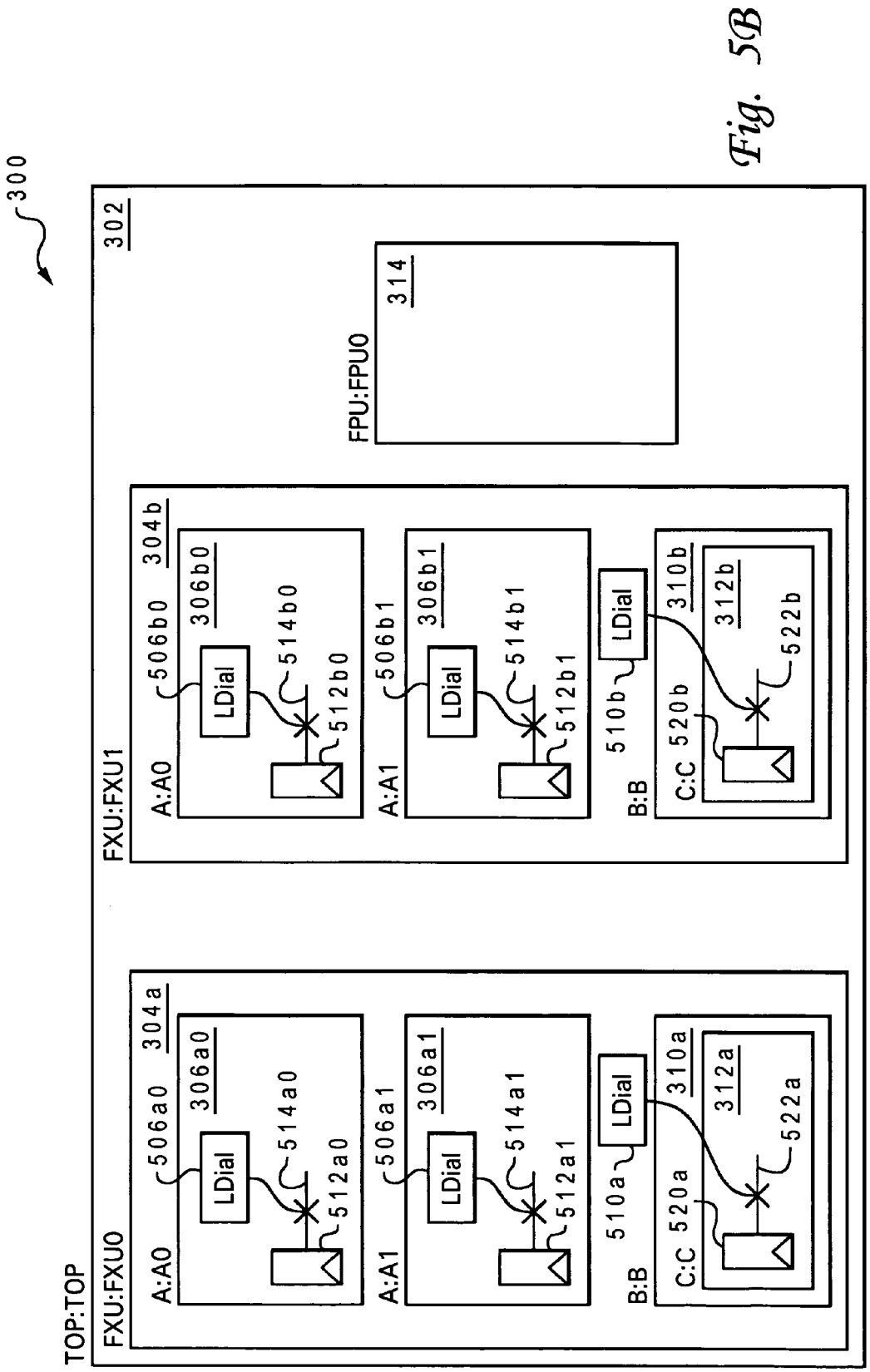
FIG. 5B depicts an exemplary digital design including a plurality of hierarchically arranged design entities in which LDials are instantiated in accordance with the present invention.

With reference now to FIG. 5B, there is illustrated a diagrammatic representation of a simulation model logically including Dials. Simulation model 300' of FIG. 5B, which as indicated by prime notation includes the same design entities arranged in the same hierarchical relation as simulation model 300 of FIG. 3, illustrates two properties of Dials, namely, replication and scope.

Replication is a process by which a Dial that is specified in or referenced by an HDL file of a design entity is automatically instantiated each time that the associated design entity is instantiated. Replication advantageously reduces the amount of data entry a designer is required to perform to create multiple identical instances of a Dial. For example, in order to instantiate the six instances of LDials illustrated in FIG. 5B, the designer need only code two LDial configuration specification statements utilizing either of the two techniques illustrated in FIGS. 4A and 4B. That is, the designer codes a first LDial configuration specification statement (or configuration file reference statement pointing to an associated configuration file) into the HDL file of design entity A 306 in order to automatically instantiate LDials 506a0, 506a1, 506b0 and 506b1 within entity A instantiations 306a0, 306a1, 306b0 and 306b1, respectively. The designer codes a second LDial configuration specification statement (or configuration file reference statement pointing to an associated configuration file) into the HDL file of design entity FXU 304 in order to automatically instantiate LDials 510a and 510b within FXU entity instantiations 304a and 304b, respectively. The multiple instances of the LDials are then created automatically as the associated design entities are replicated by the compiler. Replication of Dials within a digital design can thus significantly reduce the input burden on the designer as compared to prior art methodologies in which the designer had to individually enumerate in the configuration software each configuration latch value by hand. It should be noted that the property of replication does not necessarily require all instances of a Dial to generate the same output values; different instances of the same Dial can be set to generate different outputs by providing them different inputs.

The "scope" of a Dial is defined herein as the set of entities to which the Dial can refer in its specification. By convention, the scope of a Dial comprises the design entity with which the Dial is associated (i.e., the design entity specified by the HDL source file containing the configuration specification statement or configuration file reference statement that causes the Dial to be instantiated) and any design entity contained within the associated design entity (i.e., the associated design entity and its descendents). Thus, a Dial is not constrained to operate at the level of the design hierarchy at which it is instantiated, but can also specify configuration latches at any lower level of the design hierarchy within its scope. For example, LDials 510a and 510b, even though associated with FXU entity instantiations 304a and 304b, respectively, can specify configuration latches within entity C instantiations 312a and 312b, respectively.

FIG. 5B illustrates another important property of LDials (and other Dials that directly specify configuration latches). In particular, as shown diagrammatically in FIG. 5B, designers, who are accustomed to specifying signals in HDL files, are permitted in a configuration specification statement to specify signal states set by a Dial rather than values to be loaded into an "upstream" configuration latch that determines the signal state. Thus, in specifying LDial 506, the designer can specify possible signal states for a signal 514 set by a configuration latch 512. Similarly, in specifying LDial 510, the designer can specify possible signal states for signal 522 set by configuration latch 520. The ability to specify signal states rather than latch values not only coincides with designers' customary manner of thinking about a digital design, but also reduces possible errors introduced by the presence of inverters between the configuration latch 512, 520 and the signal of interest 514, 522, as discussed further below.

Figure 5C:
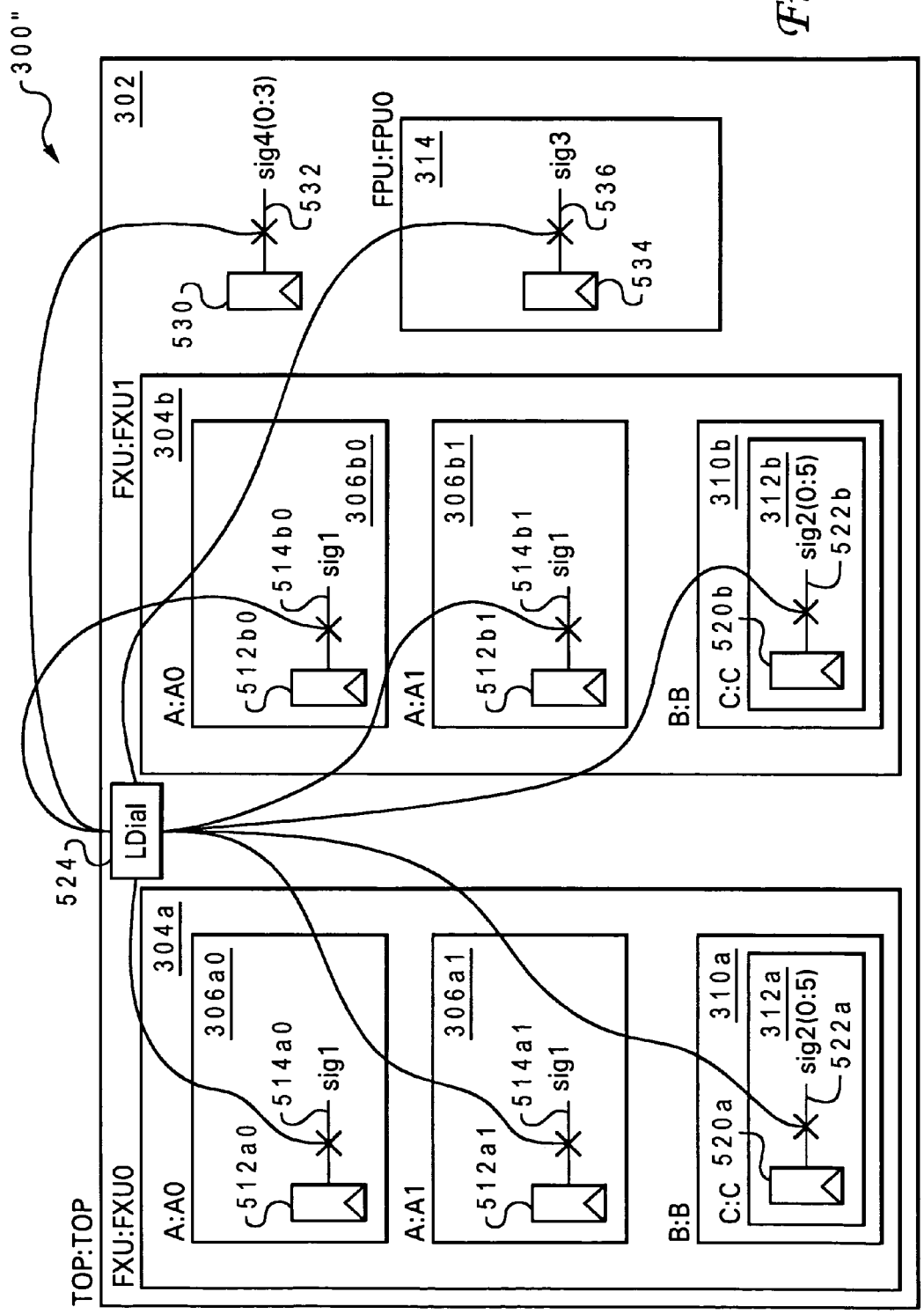
FIG. 5C illustrates an exemplary digital design including a plurality of hierarchically arranged design entities in which an LDial is employed to configure signal states at multiple different levels of the design hierarchy.

Referring now to FIG. 5C, there is depicted another diagrammatic representation of a simulation model including an LDial. As indicated by prime notation, simulation model 300" of FIG. 5C includes the same design entities arranged in the same hierarchical relation as simulation model 300 of FIG. 3.

As shown, simulation model 300" of FIG. 5C includes an LDial 524 associated with top-level design entity 302. LDial 524 specifies the signal states of each signal sig1 514, which is determined by a respective configuration latch 512, the signal states of each signal sig2 522, which is determined by a respective configuration latch 520, the signal state of signal sig4 532, which is determined by configuration latch 530, and the signal state of signal sig3 536, which is determined by configuration latch 534. Thus, LDial 524 configures the signal states of numerous different signals, which are all instantiated at or below the hierarchy level of LDial 524 (which is the top level).

As discussed above with respect to FIGS. 4A and 4B, LDial 524 is instantiated within top-level entity 302 of simulation model 300" by embedding within the HDL file of top-level entity 302 a configuration specification statement specifying LDial 524 or a configuration file reference statement referencing a separate configuration file containing a configuration specification statement specifying LDial 524. In either case, an exemplary configuration specification statement for LDial 524 is as follows:

```
LDial bus ratio (FXU0.A0.SIG1, FXU0.A1.SIG1,
    FXU0.B.C.SIG2(0..5),
    FXU1.A0.SIG1, FXU1.A1.SIG1,
    FXU1.B.C.SIG2(0..5),
    FPU0.SIG3, SIG4(0..3)
) =
{2:1 =>0b0, 0b0, 0x00,
    0b0, 0b0, 0x00,
    0b0, 0x0;
3:1 => 0b1, 0b1, 0x01,
    0b1, 0b1, 0x01,
    0b0, 0x1;
4:1 => 0b1, 0b1, 0x3F,
    0b1, 0b1, 0x3F,
    0b1, 0xF
};
```

The exemplary configuration specification statement given above begins with the keyword "LDial," which specifies that the type of Dial being declared is an LDial, and the Dial name, which in this case is "bus ratio." Next, the configuration specification statement enumerates the signal names whose states are controlled by the LDial. As indicated above, the signal identifier for each signal is specified hierarchically (e.g., FXU0.A0.SIG1 for signal 514a0) relative to the default scope of the associated design entity so that different signal instances having the same signal name are distinguishable. Following the enumeration of the signal identifiers, the configuration specification statement includes a mapping table listing the permitted enumerated input values of the LDial and the corresponding signal values for each enumerated input value. The signal values are associated with the signal names implicitly by the order in which the signal names are declared. It should again be noted that the signal states specified for all enumerated values are unique, and collectively represent the only legal patterns for the signal states.

Several different syntaxes can be employed to specify the signal states. In the example given above, signal states are specified in either binary format, which specifies a binary constant preceded by the prefix "0b", or in hexadecimal format, which specifies a hexadecimal constant preceded by the prefix "0x". Although not shown, signal states can also be specified in integer format, in which case no prefix is employed. For ease of data entry, the configuration specification language of ECAD system 35 also preferably supports a concatenated syntax in which one constant value, which is automatically extended with leading zeros, is utilized to represent the concatenation of all of the desired signal values. In this concatenated syntax, the mapping table of the configuration specification statement given above can be rewritten as:

{2:1=>0;
3:1=>0×183821;
4:1=>0×1FFFFF
}; in order to associate enumerated input value 2:1 with a concatenated bit pattern of all zeros, to associate the enumerated input value 3:1 with the concatenated bit pattern '0b110000011100000100001', and to associate the enumerated input value 4:1 with a concatenated bit pattern of all ones.

With reference now to FIG. 5D, there is illustrated a diagrammatic representation of a special case of an LDial having a one-bit output, which is defined herein as a Switch. As shown, a Switch 540 has a single input 502, a single 1-bit output 504 that controls the setting of a configuration latch 505, and a mapping table 503 that maps each enumerated input value that may be received at input 502 to a 1-bit output value driven on output 504.

Because Switches frequently comprise a significant majority of the Dials employed in a digital design, it is preferable if the enumerated value sets for all Switches in a simulation model of a digital design are the same (e.g., "ON"/"OFF"). In a typical embodiment of a Switch, the "positive" enumerated input value (e.g., "ON") is mapped by mapping table 503 to an output value of 0b1 and the "negative" enumerated input value (e.g., "OFF") is mapped to an output value of 0b0. In order to facilitate use of logic of the opposite polarity, a Negative Switch or NSwitch declaration is also preferably supported that reverses this default correspondence between input values and output values in mapping table 503.

The central advantage to defining a Switch primitive is a reduction in the amount of input that designers are required to enter. In particular, to specify a comparable 1-bit LDial, a designer would be required to enter a configuration specification statement of the form:

```
LDial mode (signal) =
    {ON =>b1;
    OFF =>b0
    };
```

A Switch performing the same function, on the other hand, can be specified with the configuration specification statement:

Switch mode (signal);

Although the amount of data entry eliminated by the use of Switches is not particularly significant when only a single Switch is considered, the aggregate reduction in data entry is significant when the thousands of switches in a complex digital design are taken into consideration.

Figure 6A:
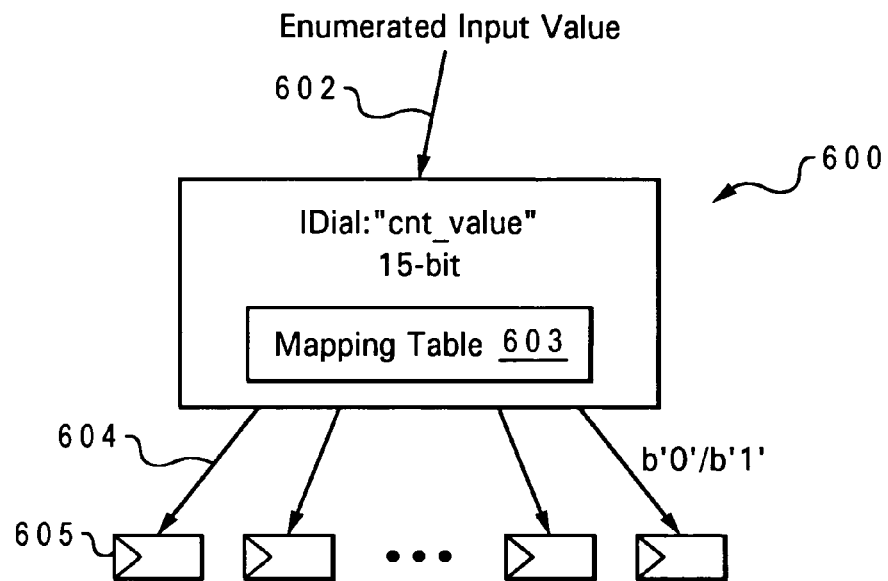
FIG. 6A is a diagrammatic representation of an IDial in accordance with the present invention.

Referring now to FIG. 6A, there is depicted a diagrammatic representation of an Integer Dial ("IDial") in accordance with a preferred embodiment of the present invention. Like an LDial, an IDial directly specifies the value loaded into each of one or more configuration latches 605 by indicating within mapping table 603 a correspondence between each input value received at an input 602 and an output value for each output 604. However, unlike LDials, which can only receive as legal input values the enumerated input values explicitly set forth in their mapping tables 503, the legal input value set of an IDial includes all possible integer values within the bit size of output 604. (Input integer values containing fewer bits than the bit size of output(s) 604 are right justified and extended with zeros to fill all available bits.) Because it would be inconvenient and tedious to enumerate all of the possible integer input values in mapping table 603, mapping table 603 simply indicates the manner in which the integer input value received at input 602 is applied to the one or more outputs 604.

IDials are ideally suited for applications in which one or more multi-bit registers must be initialized and the number of legal values includes most values of the register(s). For example, if a 4-bit configuration register comprising 4 configuration latches and an 11-bit configuration register comprising 11 configuration latches were both to be configured utilizing an LDial, the designer would have to explicitly enumerate up to $2^{15}$ input values and the corresponding output bit patterns in the mapping table of the LDial. This case can be handled much more simply with an IDial utilizing the following configuration specification statement:

IDial cnt_value (sig1(0..3), sig2(0..10));

In the above configuration specification statement, "IDial" declares the configuration construct as an IDial, "cnt_value" is the name of the IDial, "sig1" is a 4-bit signal output by the 4-bit configuration register and "sig2" is an 11-bit signal coupled to the 11-bit configuration register. In addition, the ordering and number of bits associated with each of sig1 and sig2 indicate that the 4 high-order bits of the integer input value will be utilized to configure the 4-bit configuration register associated with sig1 and the 11 lower-order bits will be utilized to configure the 11-bit configuration register associated with sig2. Importantly, although mapping table 603 indicates which bits of the integer input values are routed to which outputs, no explicit correspondence between input values and output values is specified in mapping table 603.

Figure 6B:
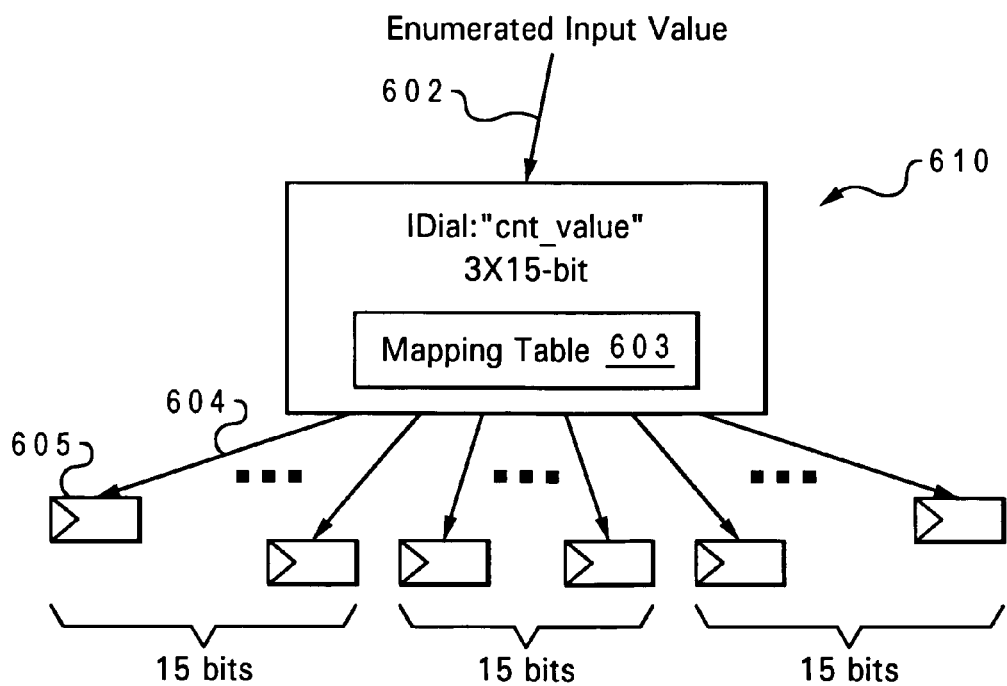
FIG. 6B is a diagrammatic representation of an IDial having a split output in accordance with the present invention.

IDials may also be utilized to specify the same value for multiple replicated configuration registers, as depicted in FIG. 6B. In the illustrated embodiment, an IDial 610, which can be described as an IDial "splitter", specifies the configuration of three sets of replicated configuration registers each comprising 15 configuration latches 605 based upon a single 15-bit integer input value. An exemplary configuration specification statement for instantiating IDial 610 may be given as follows:

IDial cnt_value(A0.sig1(0..7), A0.sig2(8..14);
A1.sig1(0..7), A1.sig2(8..14);

-continued

A3.sig1(0..7), A3.sig2(8..14)
);

In the above configuration specification statement, "IDial" declares the configuration construct as an IDial, and "cnt_value" is the name of the IDial. Following the IDial name are three scope fields separated by semicolons (";"). Each scope field indicates how the bits of the input integer value are applied to particular signals. For example, the first scope field specifies that the 8 high-order bits of the integer input value will be utilized to configure the 8-bit configuration register associated with the signal A0.sig1 and the 7 lower-order bits will be utilized to configure the 7-bit configuration register associated with A0.sig2. The second and third scope fields specify that the corresponding configuration registers within design entities A1 and A3 will be similarly configured. Importantly, the integer input bits can be allocated differently in each scope field as long as the total number of bits specified in each scope field is the same.

Although the configuration of a digital design can be fully specified utilizing LDials alone or utilizing LDials and IDials, in many cases it would be inefficient and inconvenient to do so. In particular, for hierarchical digital designs such as that illustrated in FIG. 5C, the use of LDials and/or IDials alone would force many Dials to higher levels of the design hierarchy, which, from an organizational standpoint, may be the responsibility of a different designer or design group than is responsible for the design entities containing the configuration latches controlled by the Dials. As a result, proper configuration of the configuration latches would require not only significant organizational coordination between design groups, but also that designers responsible for higher levels of the digital design learn and include within their HDL files details regarding the configuration of lower level design entities. Moreover, implementing Dials at higher levels of the hierarchy means that lower levels of the hierarchy cannot be independently simulated since the Dials controlling the configuration of the lower level design entities are not contained within the lower level design entities themselves.

In view of the foregoing, the present invention recognizes the utility of providing a configuration construct that supports the hierarchical combination of Dials to permit configuration of lower levels of the design hierarchy by lower-level Dials and control of the lower-level Dials by one or more higher-level Dials. The configuration specification language of the present invention terms a higher-level Dial that controls one or more lower-level Dials as a Control Dial ("CDial").

Figure 7A:
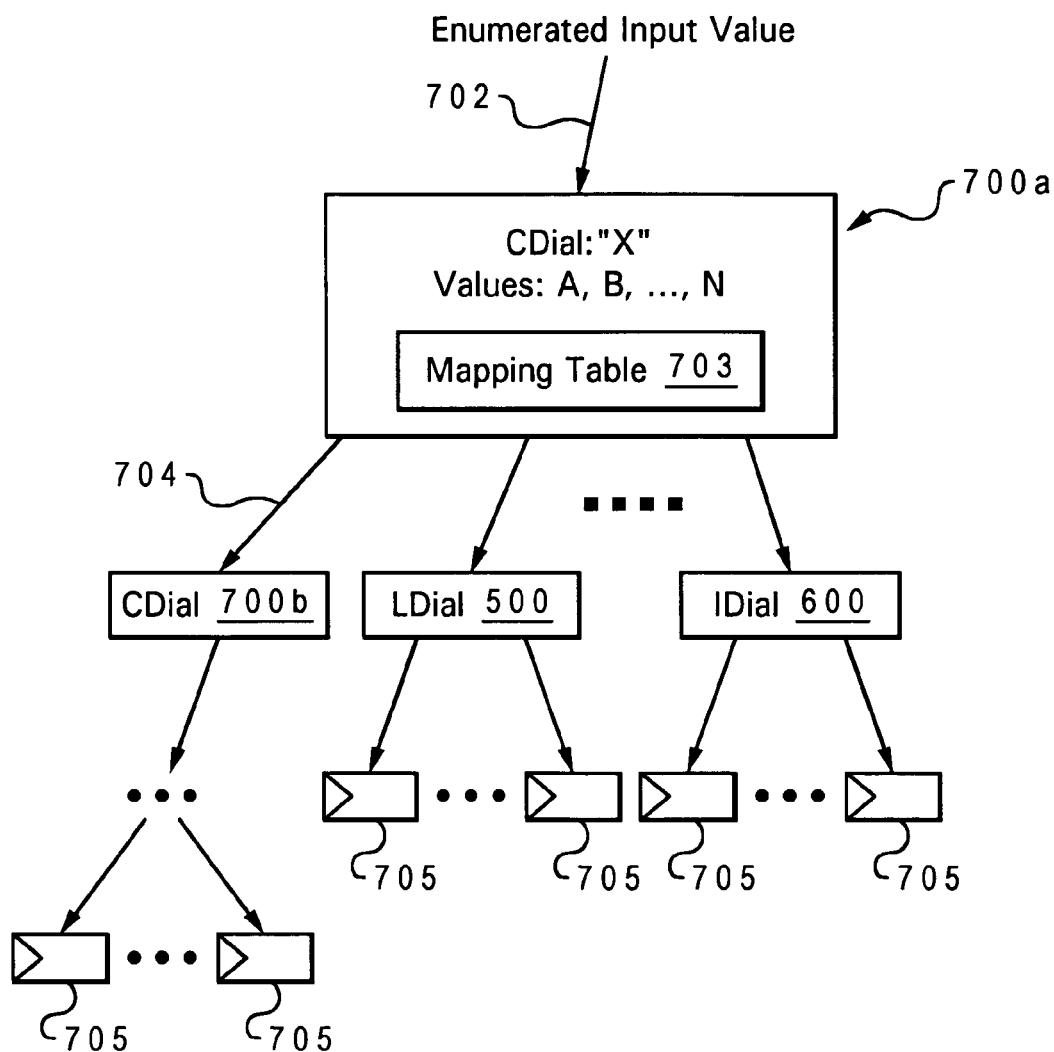
FIG. 7A is a diagrammatic representation of a CDial employed to control other Dials in accordance with the present invention.

Referring now to FIG. 7A, there is depicted a diagrammatic representation of a CDial 700a in accordance with the present invention. CDial 700a, like all Dials, preferably has a single input 702, one or more outputs 704, and a mapping table 703 that maps each input value to a respective associated output value for each output 704. Unlike LDials and IDials, which directly specify configuration latches, a CDial 700 does not directly specify configuration latches. Instead, a CDial 700 controls one or more other Dials (i.e., CDials and/or LDials and/or IDials) logically coupled to CDial 700 in an n-way "Dial tree" in which each lower-level Dial forms at least a portion of a "branch" that ultimately terminates in "leaves" of configuration latches. Dial trees are preferably constructed so that no Dial is instantiated twice in any Dial tree.

In the exemplary embodiment given in FIG. 7A, CDial 700a receives at input 702 an enumerated input value (i.e., a string) among a set of legal values including "A", ..., "N". If CDial 700a (or an LDial or IDial) is a top-level Dial (i.e., there are no Dials "above" it in a Dial tree), CDial 700a receives the enumerated input value directly from software (e.g., simulation software or firmware). Alternatively, if CDial 700a forms part of a "branch" of a dial tree, then CDial 700a receives the enumerated input value from the output of another CDial. For each legal enumerated input value that can be received at input 702, CDial 700a specifies a selected enumerated value or bit value for each connected Dial (e.g., Dials 700b, 500 and 600) in mapping table 703. The values in mapping table 703 associated with each output 704 are interpreted by ECAD system 35 in accordance with the type of lower-level Dial coupled to the output 704. That is, values specified for LDials and CDials are interpreted as enumerated values, while values specified for IDials are interpreted as integer values. With these values, each of Dials 700b, 500 and 600 ultimately specifies, either directly or indirectly, the values for one or more configuration latches 705.

Figure 7B:
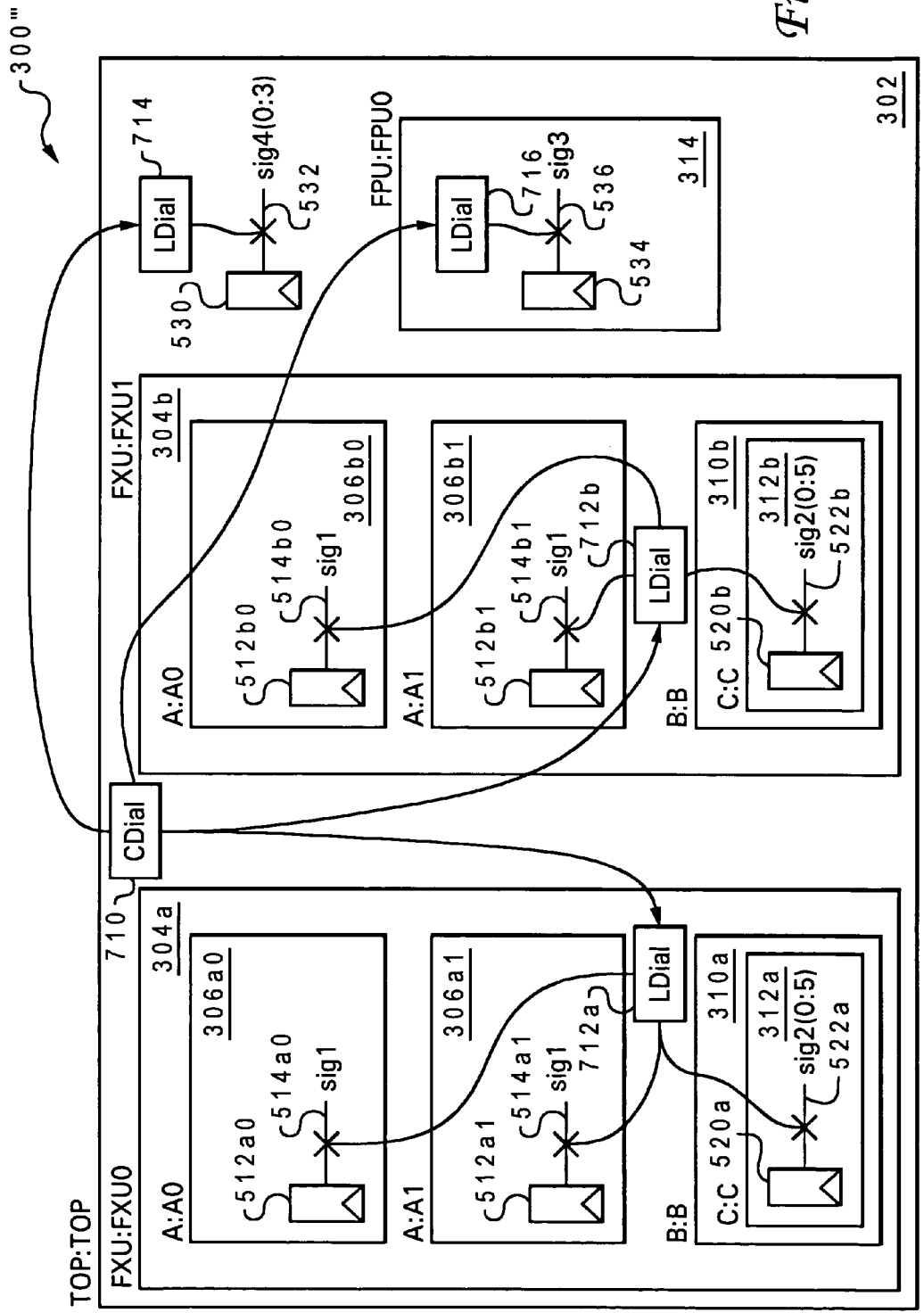
FIG. 7B depicts an exemplary digital design including a plurality of hierarchically arranged design entities in which a CDial is employed to control lower-level Dials utilized to configure signal states.

With reference now to FIG. 7B, there is illustrated another diagrammatic representation of a simulation model containing a Dial tree including a top-level CDial that controls multiple lower-level LDials. As indicated by prime notation, simulation model 300''' of FIG. 7B includes the same design entities arranged in the same hierarchical relation as simulation model 300 of FIG. 3 and contains the same configuration latches and associated signals as simulation model 300'' of FIG. 5C.

As shown, simulation model 300''' of FIG. 7B includes a top-level CDial 710 associated with top-level design entity 302. Simulation model 300''' further includes four LDials 712a, 712b, 714 and 716. LDial 712a, which is associated with entity instantiation FXU0 304a, controls the signal states of each signal sig1 514a, which is determined by a respective configuration latch 512a, and the signal state of signal sig2 522a, which is determined by configuration latch 520a. LDial 712b, which is a replication of LDial 712a associated with entity instantiation FXU1 304b, similarly controls the signal states of each signal sig1 514b, which is determined by a respective configuration latch 512b, and the signal state of signal sig2 522b, which is determined by configuration latch 520b. LDial 714, which is associated with top-level entity 302, controls the signal state of signal sig4 532, which is determined by configuration latch 530. Finally, LDial 716, which is associated with entity instantiation FPU0 314, controls the signal state of signal sig3 536, which is determined by configuration latch 534. Each of these four LDials is controlled by CDial 710 associated with top-level entity 302.

As discussed above with respect to FIGS. 4A and 4B, CDial 710 and each of the four LDials depicted in FIG. 7B is instantiated within the associated design entity by embedding a configuration specification statement (or a configuration file reference statement pointing to a configuration file containing a configuration specification statement) within the HDL file of the associated design entity. An exemplary configuration specification statement utilized to instantiate each Dial shown in FIG. 7B is given below:

```
CDial BusRatio (FXU0.BUSRATIO, FXU1.BUSRATIO,
FPU0.BUSRATIO, BUSRATIO2)=
    {2:1 => 2:1, 2:1, 2:1, 2:1;
    3:1 => 3:1, 3:1, 3:1, 3:1;
    4:1 => 4:1, 4:1, 4:1, 4:1
    };
LDial BusRatio (A0.sig1, A1.sig1, B.C.sig2(0..5)) =
    {2:1 => 0b0, 0b0, 0x00;
    3:1 => 0b1, 0b1, 0x01;
    4:1 => 0b1, 0b1, 0x3F;
    };
LDial BusRatio (sig3) =
    {2:1 => 0b0;
    3:1 => 0b0;
    4:1 => 0b1
    };
LDial BusRatio2 (sig4(0..3)) =
    {2:1 => 0x0;
    3:1 => 0x1;
    4:1 => 0xF
    };
```

By implementing a hierarchical Dial tree in this manner, several advantages are realized. First, the amount of software code that must be entered is reduced since the automatic replication of LDials 712 within FXU entity instantiations 304a and 304b allows the code specifying LDials 712 to be entered only once. Second, the organizational boundaries of the design process are respected by allowing each designer (or design team) to specify the configuration of signals within the design entity for which he is responsible. Third, coding of upper level Dials (i.e., CDial 710) is greatly simplified, reducing the likelihood of errors. Thus, for example, the CDial and LDial collection specified immediately above performs the same function as the "large" LDial specified above with reference to FIG. 5C, but with much less complexity in any one Dial.

Many Dials, for example, Switches utilized to disable a particular design entity in the event an uncorrectable error is detected, have a particular input value that the Dial should have in nearly all circumstances. For such Dials, the configuration specification language of the present invention permits a designer to explicitly specify in a configuration specification statement a default input value for the Dial. In an exemplary embodiment, a Default value is specified by including "=default value" following the specification of a Dial and prior to the concluding semicolon. For example, a default value for a CDial, can be given as follows:

```
CDial BusRatio (FXU0.BUSRATIO, FXU1.BUSRATIO,
FPU0.BUSRATIO, BUSRATIO)=
    {2:1 => 2:1, 2:1, 2:1, 2:1;
    3:1 => 3:1, 3:1, 3:1, 3:1;
    4:1 => 4:1, 4:1, 4:1, 4:1
    } = 2:1;
```

It should be noted that for CDials and LDials, the specified default value is required to be one of the legal enumerated values, which are generally (i.e., except for Switches) listed in the mapping table. For Switches, the default value must be one of the predefined enumerated values of "ON" and "OFF".

A default value for an IDial can similarly be specified as follows:

```
IDial cnt_value(A0.sig1(0..7), A0.sig2(8..14);
              A1.sig1(0..7), A1.sig2(8..14);
              A3.sig1(0..7), A3.sig2(8..14)
              ) = 0x7FFF;
```

In this case, a constant, which can be given in hexadecimal, decimal or binary format, provides the default output value of each signal controlled by the IDial. In order to apply the specified constant to the indicated signal(s), high order bits are truncated or padded with zeros, as needed.

The use of default values for Dials is subject to a number of rules. First, a default value may be specified for any type of Dial including LDials, IDials (including those with split outputs) and CDials. Second, if default values are specified for multiple Dials in a multiple-level Dial tree, only the highest-level default value affecting each "branch" of the Dial tree is applied (including that specified for the top-level Dial), and the remaining default values, if any, are ignored. Despite this rule, it is nevertheless beneficial to specify default values for lower-level Dials in a Dial tree because the default values may be applied in the event a smaller portion of a model is independently simulated, as discussed above. In the event that the combination of default values specified for lower-level Dials forming the "branches" of a Dial tree do not correspond to a legal output value set for a higher-level Dial, the compiler will flag an error. Third, a default value is overridden when a Dial receives an input to actively set the Dial.

By specifying default values for Dials, a designer greatly simplifies use of Dials by downstream organizational groups by reducing the number of Dials that must be explicitly set for simulation or hardware configuration. In addition, as discussed further below, use of default values assists in auditing which Dials have been actively set.

In addition to defining syntax for configuration specification statements specifying Dials, the configuration specification language of the present invention supports at least two additional HDL semantic constructs: comments and attribute specification statements. A comment, which may have the form:

BusRatio.comment="The bus ratio Dial configures the circuit in accordance with a selected processor/interconnect frequency ratio";

permits designers to associate arbitrary strings delimited by quotation marks with particular Dial names. As discussed below with reference to FIG. 8, these comments are processed during compilation and included within a configuration documentation file in order to explain the functions, relationships, and appropriate settings of the Dials.

Attribute specification statements are statements that declare an attribute name and attribute value and associate the attribute name with a particular Dial name. For example, an attribute specification statement may have the form:

BusRatio.attribute (myattribute)=scom57(0:9);

In this example, "BusRatio.attribute" declares that this statement is an attribute specification statement associating an attribute with a Dial having "BusRatio" as its Dial name, "myattribute" is the name of the attribute, and "scom57(0:9)" is a string that specifies the attribute value. Attributes support custom features and language extensions to the base configuration specification language.

Figure 8:
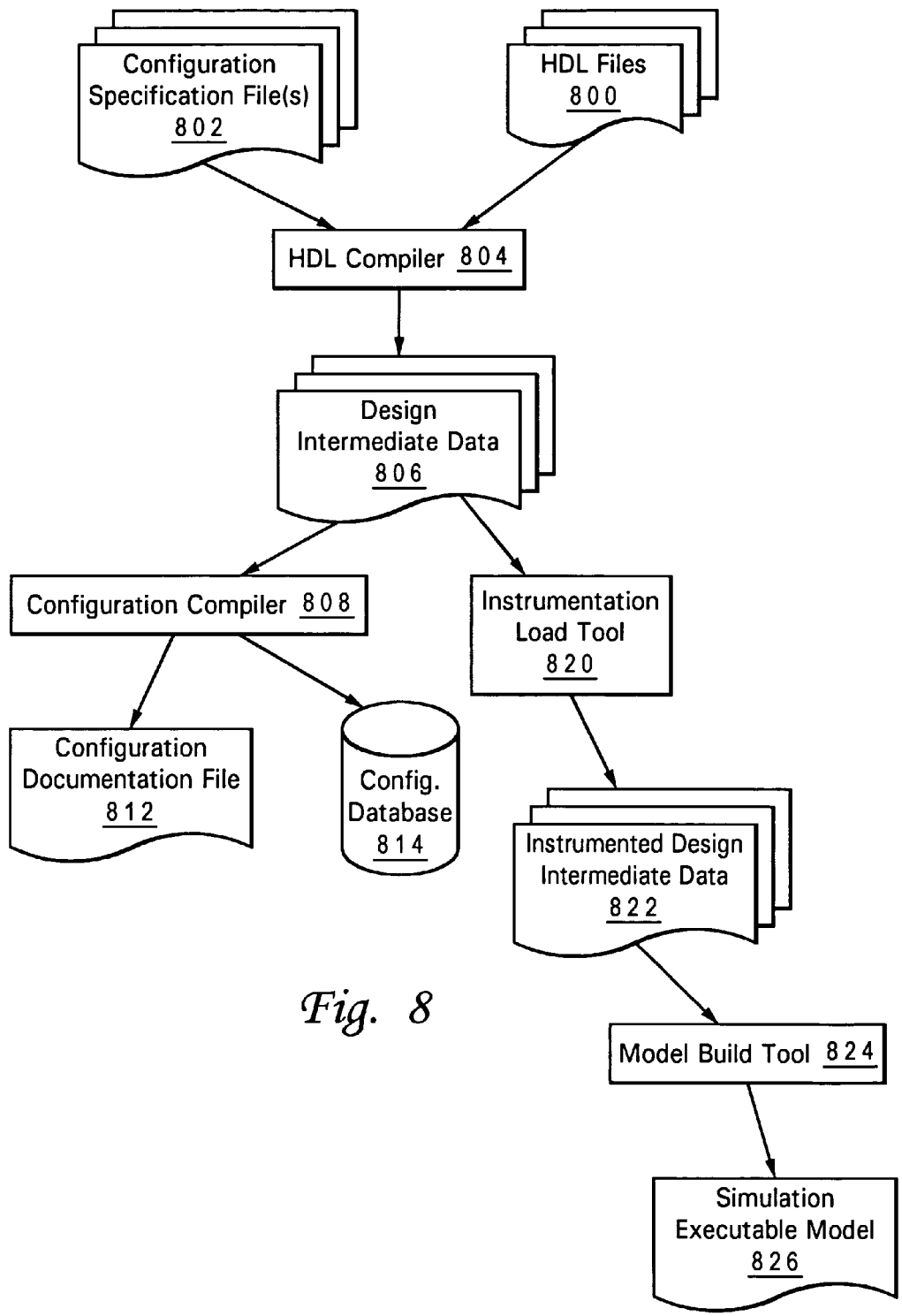
FIG. 8 is a high level flow diagram of a model build process utilized to produce an instrumented simulation executable model and associated simulation configuration database in accordance with the present invention.

Referring now to FIG. 8, there is depicted a high level flow diagram of a model build process in which HDL files containing configuration and instrumentation statements are compiled to obtain a simulation executable model and a simulation configuration database for a digital design. The illustrated process, in addition to generating design entities comprising the functional portion of a digital design and configuration constructs for configuring configuration latches within the design entities, creates instrumentation entities to track desired characteristics of the design entities and configuration constructs. The depicted process includes execution of an instrumentation load tool that is cognizant of configuration (e.g., Dial) information placed in design intermediate (proto) files and utilizes this information and to automatically create instrumentation entities to track the characteristics of the appropriate Dials.

Simulation data regarding Dials is helpful for simulation and design teams, which would like to be able to determine whether all the various settings of the Dials have, in fact, been tested during simulation and to determine what percentage of the simulation effort has been applied to each of the different settings of the Dials. In addition, attaching instrumentation entities to Dials advantageously facilitates automatic checking of Dial settings prior to simulation testing to verify that the Dials are in legal configurations. While the values to which Dials may be set can be constrained by APIs, other means, including direct alteration of latch values and logical errors in the design, can still alter Dials' underlying configuration latches to illegal states.

As shown in FIG. 8, the process begins with one or more HDL source code files 800, which include one or more design entity HDL files defining one or more design entities comprising the digital design to be simulated. As described above with reference to FIGS. 4A and 4B, these design entity HDL files include configuration specification statements and/or configuration file reference statements referring to one or more configuration specification reference files 802. Such configuration specification statements and/or configuration specification reference files define Dials (and, optionally, other configuration constructs) associated with the design entities defined by the design entity HDL files.

HDL source code files 800 may further include one or more instrumentation entity HDL files defining instrumentation entities for collecting simulation data regarding the design entities comprising the digital design. The designer need not, however, explicitly define instrumentation entities within HDL source code files 800 that collect simulation data regarding configuration constructs (e.g., Dials) because these instrumentation entities will be automatically generated during the model build process.

HDL compiler 804 processes HDL file(s) 800 and configuration specification file(s) 802, if any, beginning with the top level entity of a simulation model and proceeding in a recursive fashion through all HDL file(s) 800 describing a complete simulation model. In addition to (possibly) conventional HDL compilation of the design entity HDL files, HDL compiler 804 compiles the HDL files defining instrumentation entities, as described in U.S. patent application Ser. No. 10/366,438. HDL compiler 804 also places information in design intermediate data 806 to signify to instrumentation load tool 820 which design entities include instrumentation entities. In addition, HDL compiler 804 places information about the configuration constructs, if any, in design intermediate data 806. Thus, as HDL compiler 804 processes each HDL file 800, HDL compiler 804 creates "markers" in the design intermediate (or proto) data 806 produced in memory to identify instrumentation and configuration statements embedded in the HDL code and any configuration specification files referenced by an embedded configuration file reference statement. In a preferred embodiment, design intermediate data 806 comprise intermediate design files defining the various design entities, instrumentation entities and configuration constructs within the digital design, as well as one or more data structures defining the relationship of various instantiations of the design and instrumentation entities and configuration constructs.

The design intermediate data 806 in memory are then processed by a configuration compiler 808 in order to create a configuration documentation file 812 and a configuration database 814. Configuration documentation file 812 lists, in human-readable format, information describing the Dials associated with the simulation model. The information includes the Dials' names, their mapping tables, the structure of Dial trees, if any, instance information, etc. In addition, as noted above, configuration documentation file 812 includes strings contained in comment statements describing the functions and settings of the Dials in the digital design. In this manner, configuration documentation suitable for use with both a simulation model and a hardware implementation of a digital design is aggregated in a "bottom-up" fashion from the designers responsible for creating the Dials. The configuration documentation is then made available to all downstream organizational groups involved in the design, simulation, laboratory hardware evaluation, and commercial hardware implementation of the digital design.

Configuration database 814 contains a number of data structures pertaining to Dials. As described in U.S. patent application Ser. No. 10/425,076, these data structures include Dial data structures describing Dial entities, latch data structures, and Dial instance data structures. These data structures associate particular Dial inputs with particular configuration values used to configure the digital design (i.e., simulation executable model 826). In a preferred embodiment, the configuration values can be specified in terms of either signal states or configuration latch values, and the selection of which values are used is user-selectable. Configuration database 814 is accessed via Application Programming Interface (API) routines during simulation of the digital design utilizing simulation executable model 826 and is further utilized to generate similar configuration databases for configuring physical realizations of the digital design. In a preferred embodiment, the APIs are designed so that only top-level Dials (i.e., LDials, IDials or CDials without a CDial logically "above" them) can be set and all Dial values can be read.

Instrumentation load tool 820 also processes design intermediate data 806 to create and/or alter the in-memory data structures of the simulation model in order to add the instrumentation entities specified within design intermediate data 806 to the simulation model and to connect the instrumentation entities to the appropriate design entities. In addition, instrumentation load tool 820 searches through all the design intermediate data 806 to find Dials that can be instrumented and automatically creates an instrumentation entity for each design entity containing at least one Dial that can be instrumented. The in-memory data resulting from the processing performed by instrumentation load tool 820 are referred to as instrumented design intermediate (proto) data 822. Additional detail regarding an exemplary method of processing of design intermediate (proto) data 806 by instrumentation load tool 820 to instantiate instrumentation entities and attach the instrumentation entities to associated design entities is given below in the description of FIG. 9 and in the description of FIG. 4D of above-referenced U.S. patent application Ser. No. 10/366,438.

Instrumented design intermediate data 822 are then received as inputs by model build tool 824. Model build tool 824 processes instrumented design intermediate data 822 into a simulation executable model 826 that, when executed, models the logical functions of the digital design, which may represent, for example, a portion of an integrated circuit, an entire integrated circuit or module, or a digital system including multiple integrated circuits or modules.

It should be noted that no designer intervention is required during the entire model build process and that instrumentation entities for Dials are created automatically by intrumentation load tool 820. However, in a preferred embodiment, options regarding the automated generation of instrumentation for Dials are provided for user selection at model build time. For example, a user can preferably select the Dials to which instrumentation will automatically be applied.

Figure 9:
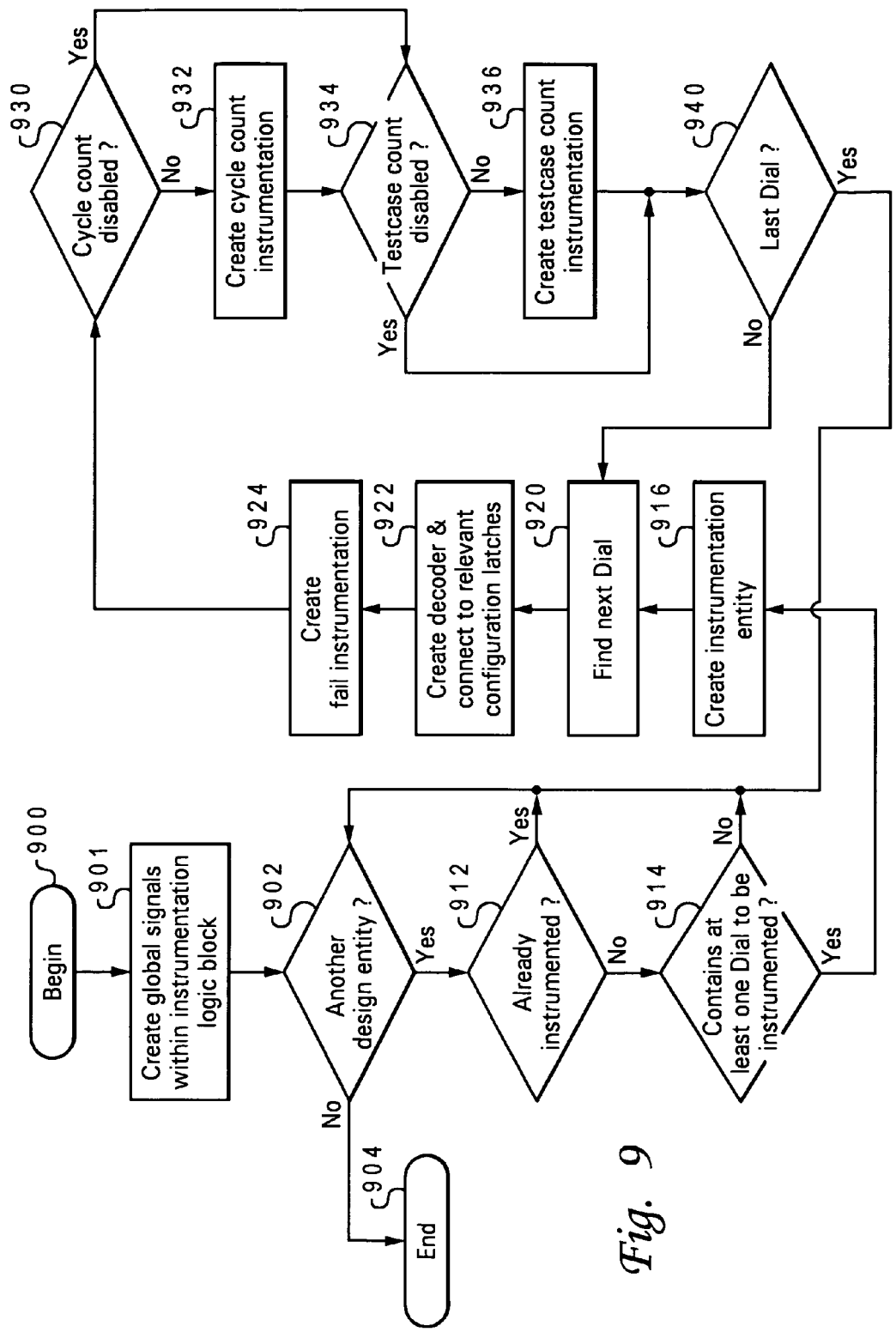
FIG. 9 is a high level logical flowchart of a method of automatically generating instrumentation for collecting simulation data regarding Dials in accordance with the present invention.

In general, the process illustrated in FIG. 8 preferably automatically instruments only those Dials having a reasonably small number of values, for example, LDials (and by implication Switches), CDials, and small IDials. Large IDials (i.e., those exceeding a width determined by default or by the user) are preferably not automatically instrumented because the large number of possible values for such IDials could generate an undesirably large number of counters. For example, fully instrumenting a 20-bit IDial would, in theory, lead to the creation of at least one event counter for each of the over one million possible settings of the IDial. Accordingly, instrumentation load tool 820 typically searches and instruments only LDials, CDials, and those IDials having less than a user-specified or default width (e.g., 7 bits). With reference now to FIG. 9, there is illustrated a more detailed logical flowchart of an exemplary method by which instrumentation load tool 820 automatically instruments Dials within a digital design. To enhance understanding, FIG. 9 is described below with reference to exemplary design entity 1000 depicted in FIG. 10. As shown, design entity 1000 includes a number of configuration latches 1030a–1030n for configuring design entity 1000. The various legal combinations of values for configuration latches 1030 form the settings of a Dial defined within design intermediate data 806.

The automatic instrumentation process depicted in FIG. 9 begins at block 900 after instrumentation load tool 820 has completed the instrumentation process for any designer-specified instrumentation, as described in U.S. patent application Ser. No. 10/366,438. As disclosed therein, this preliminary instrumentation process includes the creation of an instrumentation logic block 1002 (FIG. 10) within the top-level design entity of the simulation model. Instrumentation logic block 1002 includes counters and associated logic to support the counting of events signaled by instrumentation entities within the simulation model.

Following block 900 the process illustrated in FIG. 9 thereafter proceeds to block 901, which illustrates instrumentation load tool 820 automatically creating logic within instrumentation logic block 1002 to support the collection of simulation data of interest regarding Dials. In the exemplary embodiment, it is assumed that for each Dial to be instrumented, at least one and up to three classes of simulation data may be of interest, namely, the number of testcases run in each legal setting of the Dial, the number of simulation cycles run in each legal setting of the Dial, and logical failures causing the Dial to assume an illegal setting.

Figure 10:
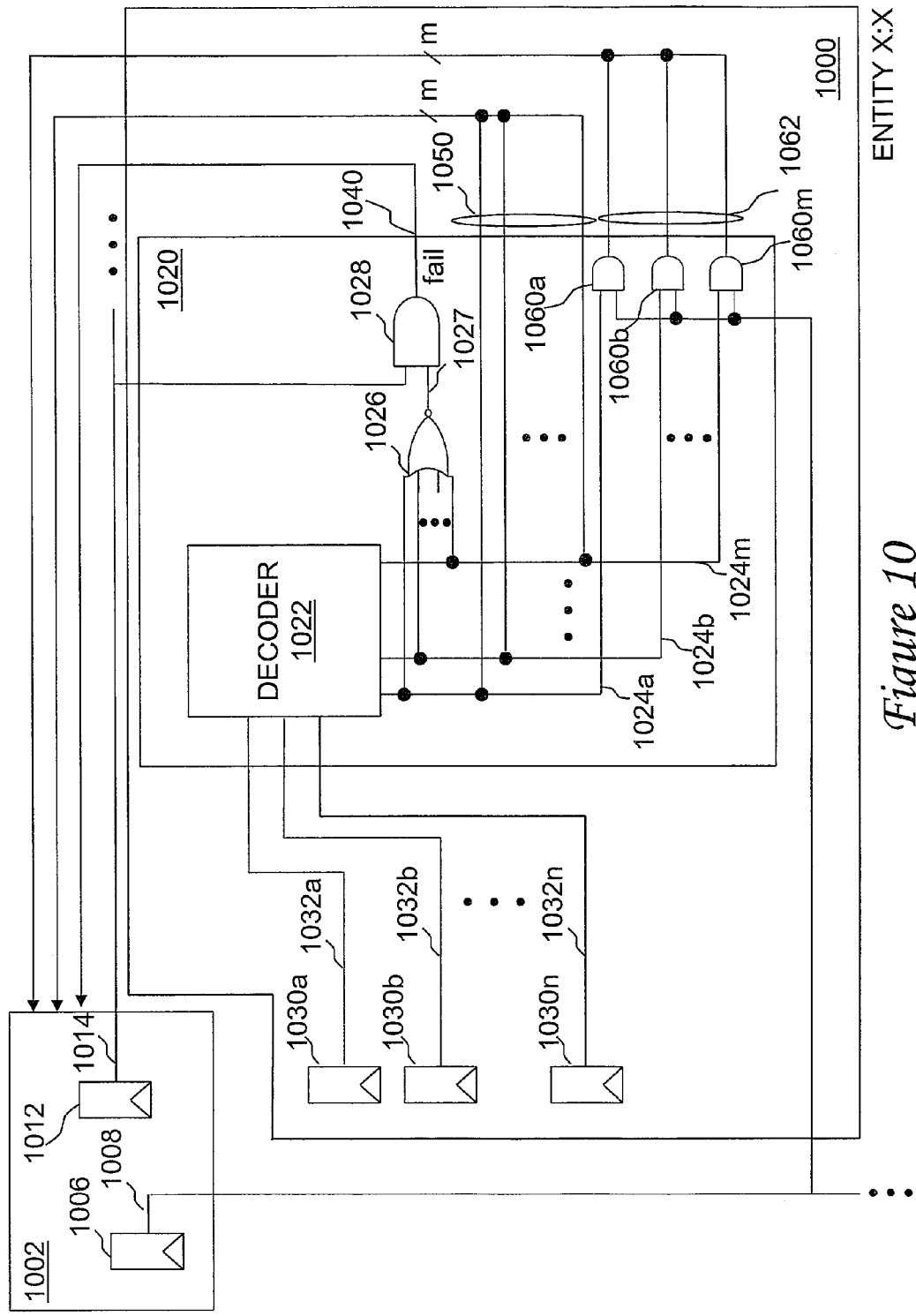
FIG. 10 is a block diagram of a design entity of a digital design in which coverage instrumentation for configuration latches is automatically generated in accordance with the present invention.

As shown in FIG. 10, the logic created by instrumentation load tool 820 at block 901 of FIG. 9 includes a testcase_qualifier latch 1006. As described further below, testcase_qualifier latch 1006 outputs a global testcase_qualifier signal 1008 utilized to qualify counting of testcases by testcase count instrumentation. In this manner, the Run Time eXecutive (RTX) program that controls simulation is able to specify (e.g., through an API) exactly when to increment testcase counts by setting global testcase_qualifier latch 1006 to pulse testcase_qualifier signal 1008 once during execution of each testcase.

The logic created by instrumentation load tool 820 at block 901 of FIG. 9 further includes a failure_qualifier latch 1012. Failure_qualifier latch 1012 outputs a global failure_qualifier signal 1014, which is activated by the RTX (through appropriate setting of failure_qualifier latch 1012 via an API) to indicate when fail events detected by Dial instrumentation logic are of interest. In general, it is common for Dials in the simulation model to be in undefined or illegal state during the initial cycles of a simulation run while the simulation model is being initialized and prepared to execute a testcase. Because the simulation model has no internal mechanism to distinguish such transient illegal states from logical failures of interest, the RTX preferably disables the monitoring of the failure events for Dials during initialization. After initialization is complete and the simulation model has stabilized, the RTX generally enables the global failure_qualifier signal 1012 for the remainder of the simulation run of the current testcase by setting failure_qualifier latch 1012.

Following block 901, the automatic instrumentation process illustrated in FIG. 9 proceeds to block 902, which depicts instrumentation load tool 820 entering a processing loop in which instrumentation load tool 820 processes each design entity specified within design intermediate data 806. If instrumentation load tool 820 has already processed all design entities specified by design intermediate data 806, then instrumentation load tool 820 ends execution of the automatic instrumentation process at block 904. If, however, instrumentation load tool 820 detects another design entity to be processed, for example, design entity 1000 of FIG. 10, the process then proceeds to block 912.

Block 912 depicts instrumentation load tool 820 determining whether or not the design entity (hereafter assumed to be design entity 1000 of FIG. 10) has already been instrumented, for example, through an incremental compilation process in which instrumented design entities are stored in non-volatile storage for inclusion in a later created simulation model. If instrumentation load tool 820 determines that design entity 1000 has already been instrumented, the process returns to block 902, which has been described. If, however, instrumentation load tool 820 determines at bock 912 that design entity 1000 has not already been instrumented, instrumentation load tool 820 scans the design intermediate data describing design entity 1000 to determine whether or not the design intermediate data contains a reference to a Dial (e.g., Switch, LDial, CDial, or "small" IDial) to be instrumented, as shown at block 914. If not, the process returns to block 902, which has been described.

Returning to block 914, in response to determining that the design intermediate data of design entity 1000 contains at least one Dial to be instrumented, the process proceeds to block 916. Block 916 illustrates instrumentation load tool 820 instantiating an embedded instrumentation entity 1020 within design entity 1000. The function of instrumentation entity 1020 is to generate, for each instrumented Dial associated with design entity 1000, one or more logic signals indicating the occurrence of events of interest (e.g., testcase count events, fail events, simulation cycle events). These event signals are recorded by associated counters within instrumentation logic block 1002 for subsequent analysis, as described in U.S. patent application Ser. No. 10/366,438. As further described in U.S. patent application Ser. No. 10/366,438, instrumentation load tool 820 names embedded instrumentation entity 1020 utilizing a special format in order to avoid name collisions with user-created instrumentation entities or design entities.

Following the creation of instrumentation entity 1020 at block 916, instrumentation load tool 820 examines the information within design intermediate data 806 for a next Dial to be instrumented, as illustrated at block 920. Next, instrumentation load tool 820 automatically generates instrumentation within instrumentation entity 1020 to gather simulation data on the Dial selected at block 920. In the illustrated embodiment, the instrumentation automatically created by instrumentation load tool 820 includes, at a minimum, failure detection instrumentation, that is, instrumentation to detect an illegal state of the Dial while global failure_qualifier 1014 is asserted. In addition, instrumentation load tool 820 optionally creates cycle count instrumentation and testcase count instrumentation in response to default or user-selected settings chosen at model build time. It will be appreciated that this implementation is merely illustrative and that, in other embodiments, additional instrumentation (or no instrumentation) could be generated for a particular Dial based upon Dial type, user-selected settings, or other factors.

In order to create failure detection instrumentation for a selected Dial, instrumentation load tool 820 first creates within instrumentation entity 1020 a decoder 1022 relating values of the underlying configuration latches 1030a-1030n associated with the Dial to each of the Dial's legal settings, as illustrated at block 922. If the Dial is an LDial or Switch, instrumentation load tool 820 constructs decoder 1022 directly from the mapping table 503 (or if a Switch, the inherent mapping table) of the Dial specified in design intermediate data 806 (possibly after tracing back specified signals to underlying latches). If, however, the Dial is a CDial, instrumentation load tool 820 constructs decoder 1022 by recursively examining the Dial tree controlled by the current CDial to determine the overall set of configuration latches 1030a–1030n controlled by the CDial and their associated legal values. Decoder 1022 thus contains all of the logic necessary to decode all the legal patterns of configuration latches 1030a–1030n and produce decode signals 1024a–1024m each corresponding to one of the legal values for the Dial.

As further illustrated at block 922 of FIG. 10, after decoder 1022 is created, instrumentation load tool 820 creates input signals 1032a–1032n to connect the underlying configuration latches 1030a–1030n associated with the Dial to embedded instrumentation entity 1020 and then to decoder 1022.

Following block 922, instrumentation load tool 820 creates failure instrumentation for the Dial at block 924. Creating the failure instrumentation includes inserting within instrumentation entity 1020 a NOR gate 1026 and an AND gate 1028. NOR gate 1026 receives all of decode signals 1024a–1024m as inputs and produces an unqualified fail signal 1027, which is then qualified with global failure_qualifier signal 1014 by AND gate 1028 to obtain a qualified fail signal 1040 indicating whether or not the Dial is in one of its legal settings. Qualified fail signal 1040 is connected to instrumentation logic block 1002. If qualified fail signal 1040 is asserted, a failure event is recorded by instrumentation logic block 1002, and simulation is halted.

The process then proceeds from block 924 to blocks 930-936, which collectively represent the selective creation of testcase count and cycle count instrumentation. In particular, instrumentation load tool 820 determines at block 930 whether or not cycle count instrumentation has been disabled for at least the current Dial by a user-specified setting. If so, the process passes directly from block 930 to block 934, which is described below. If, however, cycle count instrumentation has not been disabled, instrumentation load tool 820 creates the cycle count instrumentation within instrumentation entity 1020. In particular, instrumentation load tool 820 creates cycle count signals 1050 and connects each of them to a respective one of decode signals 1024a–1024m. Cycle count signals 1050 are automatically connected by instrumentation load tool 820 to respective event counters within instrumentation logic block 1002 in order to record the number of simulation cycles that are executed in each of the Dial's legal settings.

The process shown in FIG. 9 proceeds from block 932 (or block 930) to block 934, which depicts instrumentation load tool 820 determining whether or not testcase count instrumentation has been disabled for at least the present Dial. If so, the process passes to block 940, which is described below. If, however, testcase count instrumentation has not been disabled for the present Dial, instrumentation load tool 820 creates testcase count instrumentation within instrumentation entity 1020. In particular, instrumentation load tool 820 inserts AND gates 1060 to qualify each decode signal 1024 with global testcase_qualifier signal 1008 to obtain testcase count signals 1062. Testcase count signals 1062, which instrumentation load tool 820 automatically connects to a corresponding number of event counters within instrumentation logic block 1002, indicate the number of testcases that have been executed in each of the Dial's legal settings.

Following block 936 (or block 934), instrumentation load tool 820 determines whether or not any other Dials remain to be instrumented within the present design entity. If so, the process returns to block 920 and following blocks, which collectively represent instrumentation load tool 820 automatically creating instrumentation within instrumentation entity 1020 for each additional Dial to be instrumented with design entity 1000. If, on the other hand, no additional Dials to be instrumented remain in the present design entity, the process returns to block 902, which illustrates instrumentation load tool 820 examining the next design entity, if any.

As has been described, the present invention provides an improved method and system for facilitating the collection of simulation data regarding configuration constructs, such as Dials, that are utilized to configure a simulation model. According to a preferred embodiment of the present invention, an instrumentation entity for collecting simulation data for a Dial is automatically generated and embedded within the design entity containing the configuration latch(es) associated with the Dial. In one embodiment, the instrumentation entity generates output signals indicating the number of simulation cycles and testcases executed for each Dial setting are recorded for appropriate Dials. In addition, a failure event is triggered if the Dial assumes an illegal setting during simulation.

While the invention has been particularly shown as described with reference to a preferred embodiment, it will be understood by those skilled in the art that various changes in form and detail may be made therein without departing from the spirit and scope of the invention. For example, it will be appreciated that the concepts disclosed herein may be extended or modified to apply to other types of configuration constructs having different rules than the particular exemplary embodiments disclosed herein. In addition, although aspects of the present invention have been described with respect to a computer system executing software that directs the functions of the present invention, it should be understood that present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A method in a data processing system of building a simulation model of a digital design, said method comprising:

utilizing a model build tool to locate, within design data collectively defining a simulation model of said digital design, a definition of a configuration construct specifying a relationship between values of one or more configuration latches within said digital design and settings of said configuration construct, wherein said configuration construct comprises a Dial having a plurality of possible settings; and in response to locating said definition of said configuration construct, the model build tool automatically creating an instrumentation entity within said design data, said instrumentation entity having one or more inputs logically coupled to said one or more configuration latches and one or more outputs for providing signals indicating characteristics of said configuration construct during simulation, wherein said step of automatically creating an instrumentation entity comprises automatically creating a decoder, coupled to said one or more inputs, that produces one or more decode signals indicating one of said plurality of possible settings to which said Dial is set.

2. The method of claim 1, said one or more outputs including one or more cycle count signals indicative of simulation cycles executed in each of said plurality of possible settings of said Dial.

3. The method of claim 1, said one or more outputs further including a fail signal indicative of an illegal setting of said Dial.

4. The method of claim 3, wherein automatically creating said instrumentation entity further comprises creating failure qualification logic that qualifies any detected illegal setting of said Dial with a global failure qualification signal.

5. The method of claim 1, said one or more outputs further including one or more testcase count signals indicative of a number of testcases executed in each of said plurality of possible settings of said Dial.

6. The method of claim 5, wherein automatically creating said instrumentation entity further comprises creating testcase qualification logic that outputs said one or more testcase count signals qualified by a global testcase qualification signal.

7. The method of claim 1, and further comprising:
instantiating one or more design entities in said simulation model; and
instantiating at least said configuration construct in said simulation model.

8. A data processing system, comprising:
processing resources;
data storage coupled to said processing resources, said data storage including a model build tool executable by said processing resources to build a simulation model of a digital design, said model build tool including:
means for locating, within design data collectively defining a simulation model of said digital design, a definition of a configuration construct specifying a relationship between values of one or more configuration latches within said digital design and settings of said configuration construct, wherein said configuration construct comprises a Dial having a plurality of possible settings; and
means, responsive to locating said definition of said configuration construct, for automatically creating an instrumentation entity within said design data, said instrumentation entity having one or more inputs logically coupled to said one or more configuration latches and one or more outputs for providing signals indicating characteristics of said configuration construct during simulation, said means for automatically creating an instrumentation entity comprises means for automatically creating a decoder, coupled to said one or more inputs, that produces one or more decode signals indicating one of said plurality of possible settings to which said Dial is set.

9. The data processing system of claim 8, said one or more outputs including one or more cycle count signals indicative of simulation cycles executed in each of said plurality of possible settings of said Dial.

10. The data processing system of claim 8, said one or more outputs further including a fail signal indicative of an illegal setting of said Dial.

11. The data processing system of claim 10, wherein said means for automatically creating said instrumentation entity further comprises means for creating failure qualification logic that qualifies any detected illegal setting of said Dial with a global failure qualification signal.

12. The data processing system of claim 8, said one or more outputs further including one or more testcase count signals indicative of a number of testcases executed in each of said plurality of possible settings of said Dial.

13. The data processing system of claim 12, wherein said means for automatically creating said instrumentation entity further comprises means for creating testcase qualification logic that outputs said one or more testcase count signals qualified by a global testcase qualification signal.

14. The data processing system of claim 8, said model build tool further comprising:
means for instantiating one or more design entities in said simulation model; and
means for instantiating at least said configuration construct in said simulation model.

15. A program product, comprising:
a computer readable storage medium; and
a model build tool within said computer readable storage medium, said model build tool including:
means for locating, within design data collectively defining a simulation model of said digital design, a definition of a configuration construct specifying a relationship between values of one or more configuration latches within said digital design and settings of said configuration construct, wherein said configuration construct comprises a Dial having a plurality of possible settings; and
means, responsive to locating said definition of said configuration construct, for automatically creating an instrumentation entity within said design data, said instrumentation entity having one or more inputs logically coupled to said one or more configuration latches and one or more outputs for providing signals indicating characteristics of said configuration construct during simulation, said means for automatically creating an instrumentation entity comprises means for automatically creating a decoder, coupled to said one or more inputs, that produces one or more decode signals indicating one of said plurality of possible settings to which said Dial is set.

16. The program product of claim 15, said one or more outputs including one or more cycle count signals indicative of simulation cycles executed in each of said plurality of possible settings of said Dial.

17. The program product of claim 15, said one or more outputs further including a fail signal indicative of an illegal setting of said Dial.

18. The program product of claim 17, wherein said means for automatically creating said instrumentation entity further comprises means for creating failure qualification logic that qualifies any detected illegal setting of said Dial with a global failure qualification signal.

19. The program product of claim 15, said one or more outputs further including one or more testcase count signals indicative of a number of testcases executed in each of said plurality of possible settings of said Dial.

20. The program product of claim 19, wherein said means for automatically creating said instrumentation entity further comprises means for creating testcase qualification logic that outputs said one or more testcase count signals qualified by a global testcase qualification signal.

21. The program product of claim 15, said model build tool further comprising:
means for instantiating one or more design entities in said simulation model; and
means for instantiating at least said configuration construct in said simulation model.

* * * * *